US012176345B2

(12) United States Patent
Xie et al.

(10) Patent No.: US 12,176,345 B2

(45) Date of Patent: Dec. 24, 2024

(54) STACKED FET WITH INDEPENDENT GATE CONTROL

(71) Applicant: International Business Machines Corporation, Armonk, NY (US)

(72) Inventors: Ruilong Xie, Niskayuna, NY (US); Julien Frougier, Albany, NY (US); Kangguo Cheng, Schenectady, NY (US); Juntao Li, Cohoes, NY (US); Chanro Park, Clifton Park, NY (US)

(73) Assignee: International Business Machines Corporation, Armonk, NY (US)

(*) Notice: Subject to any disclaimer, the term of this patent is extended or adjusted under 35 U.S.C. 154(b) by 535 days.

(21) Appl. No.: 17/482,928

(22) Filed: Sep. 23, 2021

(65) Prior Publication Data

US 2023/0090346 A1 Mar. 23, 2023

(51) Int. Cl.

| | |
|---|---|
| ***H01L 29/78*** | (2006.01) |
| ***H01L 21/822*** | (2006.01) |
| ***H01L 21/8234*** | (2006.01) |
| ***H01L 27/06*** | (2006.01) |
| ***H01L 27/088*** | (2006.01) |
| ***H01L 29/66*** | (2006.01) |

(52) U.S. Cl.

CPC ...... *H01L 27/0688* (2013.01); *H01L 21/8221* (2013.01); *H01L 21/823431* (2013.01); *H01L 27/0886* (2013.01); *H01L 29/66545* (2013.01)

(58) Field of Classification Search

None

See application file for complete search history.

(56) References Cited

U.S. PATENT DOCUMENTS

| | | | |
|---|---|---|---|
| 7,683,428 | B2 | 3/2010 | Chidambarrao et al. |
| 9,659,963 | B2 | 5/2017 | Cheng et al. |
| 10,192,819 | B1 | 1/2019 | Chanemougame et al. |

(Continued)

FOREIGN PATENT DOCUMENTS

| | | | |
|---|---|---|---|
| CN | 101399207 | A | 4/2009 |
| WO | 2023046013 | A1 | 3/2023 |

OTHER PUBLICATIONS

S. Subramanian et al., "First Monolithic Integration of 3D Complementary FET (CFET) on 300mm Wafers," 2020 Symposium on VLSI Technology Digest of Technical Papers—TH3.1, Jun. 2020 (2 pages).

(Continued)

*Primary Examiner* — Joseph C. Nicely

*Assistant Examiner* — Lamont B Koo

(74) *Attorney, Agent, or Firm* — Randy Tejeda

(57) ABSTRACT

Stacked FET devices having independent and shared gate contacts are provided. In one aspect of the invention, a stacked FET device includes: a bottom-level FET(s) having a bottom-level FET gate; a top-level FET(s) having a top-level FET gate, wherein an upper portion of the bottom-level FET gate is adjacent to the top-level FET gate; a dielectric sidewall spacer in between the upper portion of the bottom-level FET gate and the top-level FET gate; and a dielectric gate cap disposed over the bottom and top-level FET gates that includes a different dielectric material from the dielectric sidewall spacer. A device having at least one first stacked FET device and at least one second stacked FET device, and a method of forming a stacked FET device are also provided.

20 Claims, 26 Drawing Sheets

(56) References Cited

U.S. PATENT DOCUMENTS

| | | | |
|---|---|---|---|
| 10,192,867 | B1 | 1/2019 | Frougier et al. |
| 10,510,622 | B1 | 12/2019 | Frougier et al. |
| 10,692,768 | B1 | 6/2020 | Rubin et al. |
| 2011/0012085 | A1 | 1/2011 | Deligianni et al. |
| 2016/0118404 | A1 | 4/2016 | Peng |
| 2018/0130811 | A1 | 5/2018 | Leobandung |
| 2018/0190769 | A1 | 7/2018 | Leobandung |
| 2018/0374753 | A1 | 12/2018 | Pawlak et al. |
| 2019/0131394 | A1 | 5/2019 | Reznicek et al. |
| 2019/0172755 | A1 | 6/2019 | Smith et al. |
| 2020/0066903 | A1* | 2/2020 | Bao .................. H01L 29/66545 |
| 2020/0075409 | A1 | 3/2020 | Wang et al. |

OTHER PUBLICATIONS

Ryckaert J. et al., “The Complementary FET (CFET) for CMOS scaling beyond N3,” 2018 Symposium on VLSI Technology Digest of Technical Papers, Jun. 2018 (2 pages).
International Search Report and Written Opinion for PCT/CN2022/120546 dated Dec. 16, 2022 (9 pages).

* cited by examiner

STACKED FET WITH INDEPENDENT GATE CONTROL

FIELD OF THE INVENTION

The present invention relates to stacked field-effect transistor (FET) devices, and more particularly, to stacked FET devices having self-aligned, independent and shared gate contacts, and techniques for formation thereof.

BACKGROUND OF THE INVENTION

Stacking can be employed to reduce the footprint area of field-effect transistor (FET) devices. With a stacked device design, at least one FET is placed vertically on top of at least one other, complementary FET. For instance, a p-channel FET (PFET) can be stacked on top of an n-channel FET (NFET), or vice versa.

Stacking FET devices in this manner presents some notable challenges. For instance, a multi-gate stacked FET integrates more than one gate into a single device. However, it is a challenge to employ multiple independent gate contacts in a stacked FET device. Even further, conventional approaches do not generally offer any flexibility in producing independent and shared gate contacts in a multi-gate stacked FET device design.

Therefore, techniques for efficiently and effectively forming stacked FET devices having independent and shared gate contacts would be desirable.

SUMMARY OF THE INVENTION

The present invention provides stacked field-effect transistor (FET) devices having self-aligned, independent and shared gate contacts. In one aspect of the invention, a stacked FET device is provided. The stacked FET device includes: at least one bottom-level FET having a bottom-level FET gate; at least one top-level FET, over the at least one bottom-level FET, having a top-level FET gate, wherein an upper portion of the bottom-level FET gate is adjacent to the top-level FET gate; a dielectric sidewall spacer in between the upper portion of the bottom-level FET gate and the top-level FET gate; and a dielectric gate cap disposed over the bottom-level FET gate and the top-level FET gate, wherein the dielectric gate cap includes a different dielectric material from the dielectric sidewall spacer.

In another aspect of the invention, a device is provided. The device includes: at least one first stacked FET device having a first bottom-level FET with a bottom-level FET gate I and a first top-level FET, over the first bottom-level FET, with a top-level FET gate II, wherein an upper portion of the bottom-level FET gate I is adjacent to the top-level FET gate II; at least one second stacked FET device having a second bottom-level FET with a bottom-level FET gate III and a second top-level FET, over the second bottom-level FET, with a top-level FET gate IV, wherein an upper portion of the bottom-level FET gate III is adjacent to the top-level FET gate IV; dielectric sidewall spacers in between the upper portion of the bottom-level FET gate I and the top-level FET gate II, and in between the upper portion of the bottom-level FET gate III and the top-level FET gate IV; and a dielectric gate cap disposed on both the upper portion of the bottom-level FET gate and the top-level FET gate, wherein the dielectric gate cap includes a different dielectric material from the dielectric sidewall spacers.

In yet another aspect of the invention, a method for forming a stacked FET device is provided. The method includes: forming at least one bottom-level FET having a first sacrificial gate; forming at least one top-level FET over the at least one bottom-level FET, the at least one top-level FET having a second sacrificial gate; patterning a bottom gate access opening in the second sacrificial gate that extends down to the first sacrificial gate; forming dielectric sidewall spacers along sidewalls of the bottom gate access opening; removing the first sacrificial gate and the second sacrificial gate to form first gate trenches in the bottom-level FET and second gate trenches in the top-level FET; forming a first replacement gate in the first gate trenches and in the bottom gate access opening, and a second replacement gate in the second gate trenches; and forming a dielectric gate cap on the first replacement gate and the second replacement gate, wherein the dielectric gate cap includes a different dielectric material from the dielectric sidewall spacers.

A more complete understanding of the present invention, as well as further features and advantages of the present invention, will be obtained by reference to the following detailed description and drawings.

DETAILED DESCRIPTION OF PREFERRED EMBODIMENTS

As highlighted above, stacked field-effect transistor (FET) designs advantageously reduce the footprint area of the device. With these designs, at least one FET, i.e., a top-level FET(s), is/are placed vertically on top of at least one other FET, i.e., a bottom-level FET(s). Provided herein are stacked field-effect transistor (FET) devices having self-aligned gate contacts, and techniques for fabrication thereof. Advantageously, the present techniques offer flexibility in producing these self-aligned gate contacts as independent and/or shared gate contacts in a multi-gate stacked FET device design. For instance, as will be described in detail below, stacked FET device designs are contemplated herein where self-aligned gate contacts are provided for a stacked FET device with independent gate control, and at least one other gate contact is provided for a stacked FET device with a shared gate.

This design is enabled through the use of dielectric sidewall spacers in between the bottom and top gate stacks, and a gate cap of a different dielectric material on the bottom and top gate stacks. As will be described in detail below, the dielectric gate cap is opened selective to the dielectric sidewall spacers to form the self-aligned gate contacts for the independent gate stacked FET device. Conversely, the dielectric sidewall spacers are opened selective to the dielectric gate cap for the shared gate stacked FET device.

Figure 1:
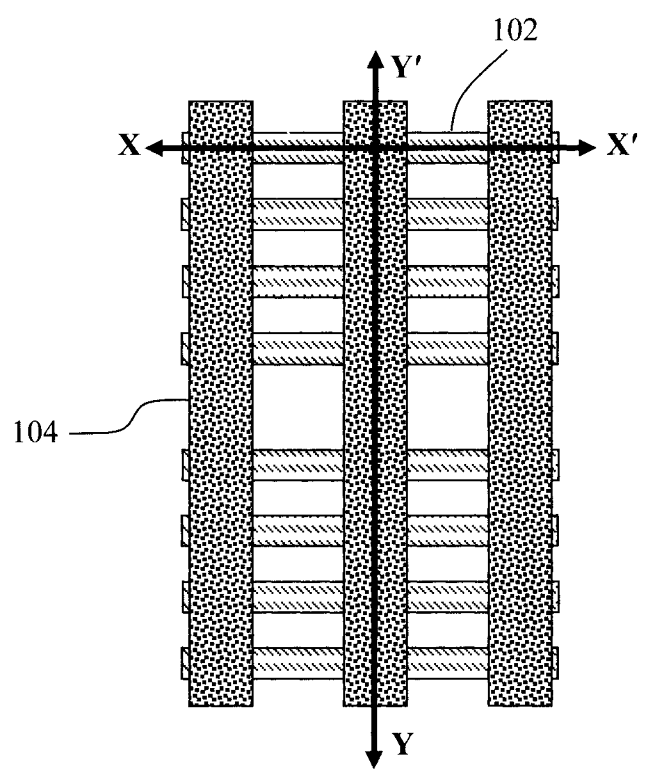
FIG. 1 is a top-down view of an exemplary bottom-level FET(s) illustrating an orientation of the X-X' and Y-Y' cross-sectional views shown in the figures according to an embodiment of the present invention.

Given the above overview, an exemplary methodology for forming a stacked FET device in accordance with the present techniques having self-aligned independent and shared gate contacts is now described by way of reference to FIGS. 1-19. FIG. 1 is a top-down diagram illustrating an orientation of the cross-sectional views that will be shown in the figures that follow. Namely, as shown in FIG. 1, according to an exemplary embodiment, the bottom-level FET(s) are finFET devices that include a plurality of fins 102 extending along a first direction (in this case along an X-direction). A plurality of sacrificial gates 104 are present over the fins 102. As shown in FIG. 1, the sacrificial gates 104 extend along a second direction (in this case along a Y-direction) which is perpendicular to the first/X-direction.

Namely, as will be described in detail below, a gate-last process is employed herein where sacrificial gates (such as sacrificial gates 104) are formed early on in the process and serve as placeholders during source/drain formation. The term 'sacrificial' as used herein refers to a structure that is removed, in whole or in part, during fabrication of the stacked FET device. Later on, the sacrificial gates are removed and replaced with the final gates of the FET device. When these 'replacement' gates are formed from metal gate stack materials, they are also referred to herein as 'replacement metal gates' or 'RMG.' The use of a gate-last process is advantageous as it prevents exposure of the gate stack materials to potentially damaging conditions during processing. For instance, the high-κ dielectrics (see below) used in the replacement metal gate stacks can be damaged by exposure to high temperatures. Accordingly, with the gate-last approach, these gate stack materials are only placed near the end of the process after such high temperature anneals have been performed. Therefore, at this stage in the process, the gates shown in FIG. 1 are the sacrificial gates 104. However, the orientation of the replacement gates (see below) will be the same as that of the sacrificial gates 104.

The X-X' cross-sectional views that will be shown in the figures that follow depict cuts along a given one of the fins 102, through each of the sacrificial gates 104. The Y-Y' cross-sectional views that will be shown in the figures that follow depict cuts along one of the sacrificial gates 104, through each of the fins 102. It is notable, however, that the present techniques are more generally applicable to any type of stacked FET device design including planar and other non-planar FETs such as nanowire/nanosheet FETs, and the implementation of a finFET design for the bottom and top-level FETs is used merely as one illustrative, non-limiting example to describe the present techniques.

Thus, according to an exemplary embodiment, the process begins with the formation of at least one bottom-level FET. To do so, fins 102 for the bottom-level FET(s) (also referred to herein as 'bottom-level FET fins 102') are first patterned in a substrate 202. See FIG. 2A (an X-X' cross-sectional view) and FIG. 2B (a Y-Y' cross-sectional view). According to an exemplary embodiment, substrate 202 is a bulk semiconductor wafer, such as a bulk silicon (Si), bulk germanium (Ge), bulk silicon germanium (SiGe) and/or bulk III-V semiconductor wafer. Alternatively, substrate 202 can be a semiconductor-on-insulator (SOI) wafer. A SOI wafer includes a SOI layer separated from an underlying substrate by a buried insulator. When the buried insulator is an oxide it is also referred to herein as a buried oxide or BOX. The SOI layer can include any suitable semiconductor material(s), such as Si, Ge, SiGe and/or a III-V semiconductor. Further, substrate 202 may already have pre-built structures (not shown) such as transistors, diodes, capacitors, resistors, interconnects, wiring, etc.

Figure 2A:
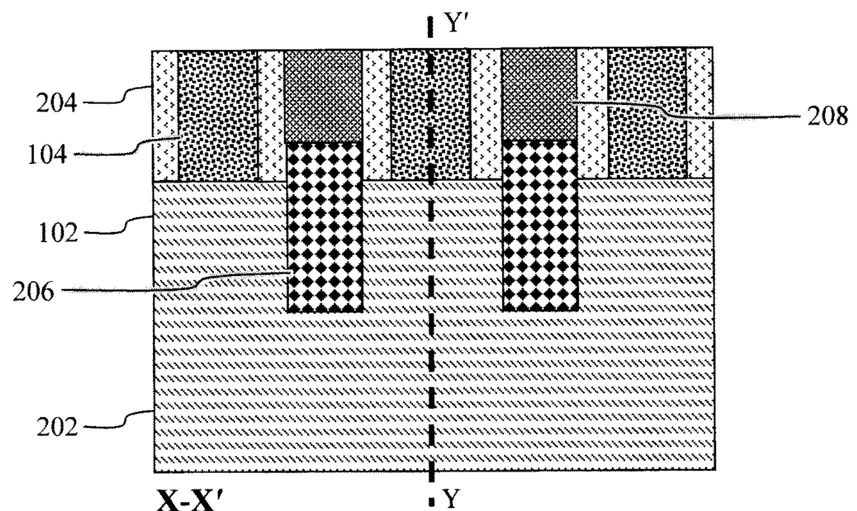
FIG. 2A is an X-X' cross-sectional view illustrating bottom-level FET(s) with (first) sacrificial gates having been formed on a substrate.
Figure 2B:
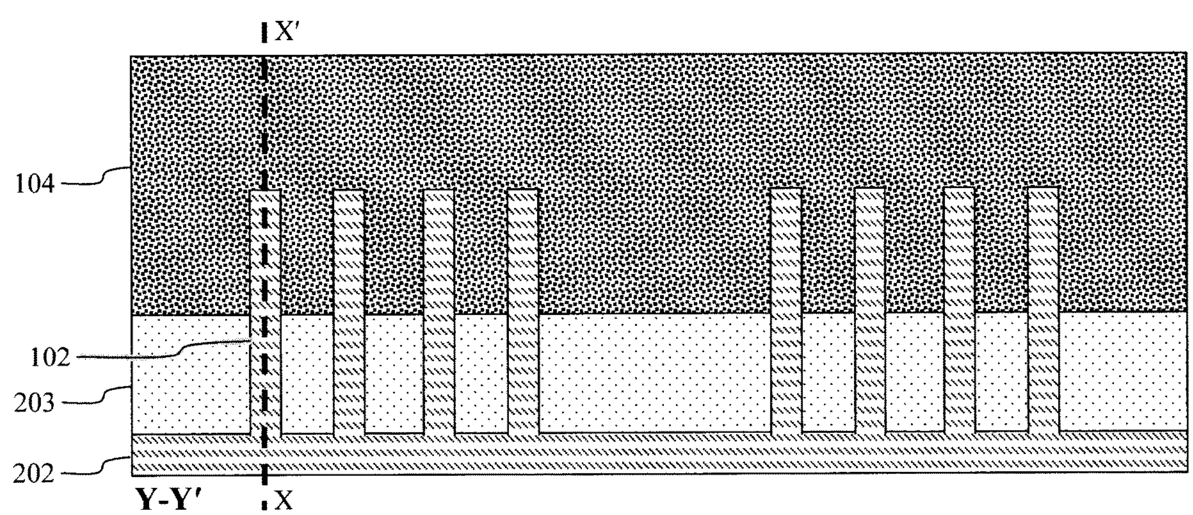
FIG. 2B is a Y-Y' cross-sectional view illustrating the bottom-level FET(s) with the first sacrificial gates having been formed on the substrate according to an embodiment of the present invention.
Figure 3A:
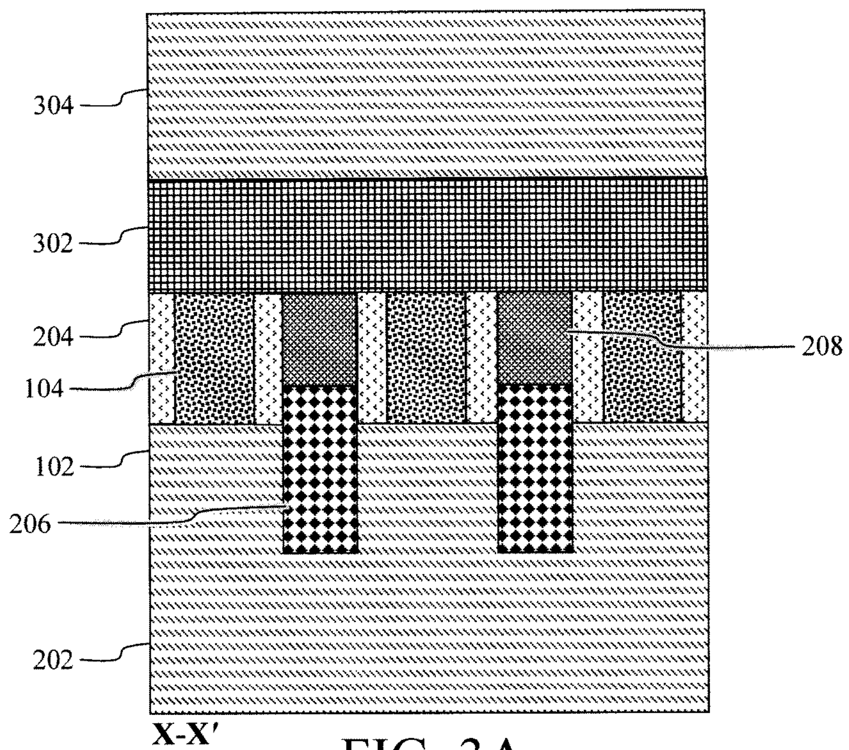
FIG. 3A is an X-X' cross-sectional view illustrating a top-level FET channel layer having been formed over the bottom-level FET(s) using a wafer bonding technique.
Figure 3B:
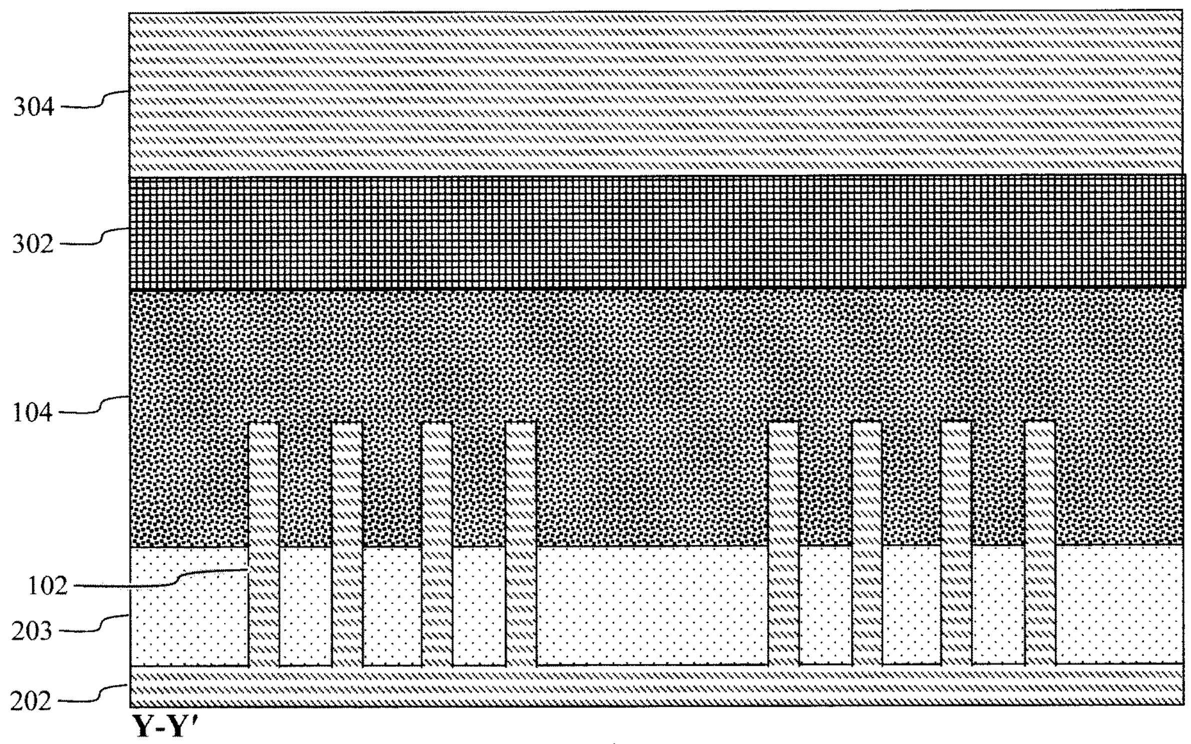
FIG. 3B is a Y-Y' cross-sectional view illustrating the top-level FET channel layer having been formed over the bottom-level FET(s) according to an embodiment of the present invention.

Standard lithography and etching techniques can be employed to pattern the bottom-level FET fins 102 in the substrate 202. With standard lithography and etching techniques, a lithographic stack (not shown), e.g., photoresist/organic planarizing layer (OPL)/anti-reflective coating (ARC), is used to pattern a fin hardmask (not shown) with the footprint and location of each of the features to be patterned in the underlying substrate (in this case the bottom-level FET fins 102). Alternatively, advanced lithography patterning techniques such as self-aligned double patterning (SADP) and self-aligned quadruple patterning (SAQP) can be used to define the fins at small fin size and at very small fin pitch. An etch is then performed to transfer the pattern from the hardmask to the underlying substrate 202 to form the bottom-level FET fins 102 shown in FIGS. 2A and 2B. As shown in FIGS. 2A and 2B, as-patterned, the bottom-level FET fins 102 extend partway through the substrate 202. After the bottom-level FET fins 102 are formed, shallow trench isolation (STI) regions 203 are formed by dielectric deposition and chemical-mechanical polishing (CMP) followed by dielectric recess. After that, the fin hardmask can also be removed.

One or more sacrificial gates 104 are formed on the bottom-level FET fins 102. It is notable that the number of sacrificial gates 104 shown in the figures is merely an example, and embodiments are contemplated herein where more or fewer sacrificial gates 104 than shown are present, including embodiments where a single sacrificial gate 104 is employed. Suitable materials for the sacrificial gates 104 include, but are not limited to, poly-silicon (poly-Si) and/or amorphous silicon (a-Si) which can be deposited onto the bottom-level FET fins 102 using a process such as chemical vapor deposition (CVD), atomic layer deposition (ALD) or physical vapor deposition (PVD). Although not shown in the figures, it is notable that prior to deposition of the sacrificial gate material, a thin layer of silicon dioxide ($SiO_2$) can be deposited to separate the fins from the sacrificial gates 104. Standard lithography and etching techniques (see above) are then employed to pattern the sacrificial gate material into the sacrificial gates 104. Namely, following deposition of the sacrificial gate material, a sacrificial gate hardmask (not shown) is deposited over the sacrificial gate material. In the same manner as described above, the sacrificial gate hardmask is patterned with the footprint and location of the sacrificial gates 104. The pattern is then transferred from the gate hardmask to the sacrificial gate material to form the individual sacrificial gates 104 shown in FIGS. 2A and 2B.

Gate spacers 204 are formed on opposite sides of the sacrificial gates 104 and the sacrificial gate hardmask. Suitable materials for the gate spacers 204 include, but are not limited to, oxide spacer materials such as silicon oxide (SiOx) and/or silicon oxycarbide (SiOC) and/or nitride spacer materials such as silicon nitride (SiN), silicon borocarbonitride (SiBCN) and/or silicon oxycarbonitride (SiOCN) which can be deposited over the sacrificial gates 104 using a process such as CVD, ALD or PVD. A directional (i.e., anisotropic) etching process such as reactive ion etching (RIE) is then employed to remove the horizontal portions of the gate spacer material such that only vertical portions of the gate spacer material (which are the gate spacers 204) are left along the sidewall of sacrificial gates 104 and the sacrificial gate hardmask as shown in FIG. 2A. After formation of the gate spacers 204, the exposed portions of the bottom-level FET fins 102 that are not covered by the sacrificial gates 104 or gate spacers 204 will be recessed, followed by epitaxial growth of the source/drain regions 206 of the bottom-level FET(s).

Gate spacers 204 offset the sacrificial gates 104 from source/drain regions 206 of the bottom-level FET(s) (also referred to herein as 'bottom-level FET source/drain regions 206') that are formed in the bottom-level FET fins 102 on opposite sides of the sacrificial gates 104. According to an exemplary embodiment, the bottom FET source/drain regions 206 are formed from an in-situ doped (i.e., where a dopant(s) is introduced during growth) or ex-situ doped (e.g., where a dopant(s) is introduced by ion implantation) epitaxial material such as epitaxial Si, epitaxial SiGe, etc. Suitable n-type dopants include, but are not limited to, phosphorous (P) and/or arsenic (As). Suitable p-type dopants include, but are not limited to, boron (B).

Following formation of the bottom FET source/drain regions 206, an interlayer dielectric (ILD) 208 is deposited over the bottom FET source/drain regions 206 and burying the sacrificial gates 104/gate spacers 204. Suitable materials for ILD 208 include, but are not limited to, oxide materials such as SiOx and/or organosilicate glass (SiCOH) and/or ultralow-κ interlayer dielectric (ULK-ILD) materials, e.g., having a dielectric constant κ of less than 2.7. Suitable ultralow-κ dielectric materials include, but are not limited to, porous organosilicate glass (pSiCOH). A process such as CVD, ALD, or PVD can be used to deposit the ILD 208. Following deposition, the ILD 208 is polished down to the top surface of the sacrificial gates 104 using a process such as chemical-mechanical polishing (CMP), fully removing the sacrificial gate hardmask from over the sacrificial gates 104. Further details of the above-described process for forming the bottom-level (and top-level) FETs are provided in FIG. 19—described below, including some of the intermediate steps and structures not visible in FIGS. 2A and 2B, such as the sacrificial gate hardmasks.

In order to help illustrate the arrangement of the various structures amongst the views shown, the orientation of the Y-Y' cut (shown in FIG. 2B) and the orientation of the X-X' cut (shown in FIG. 2A) are marked in FIG. 2A and FIG. 2B, respectively. For ease and clarity of depiction, these designations are not marked in the remaining figures. However, it is to be understood that the orientation of the Y-Y' cuts and the orientation of the X-X' cuts are the same as that shown in FIG. 2A and FIG. 2B.

The top-level FET(s) are then formed over the bottom-level FET(s). To do so, a channel layer 304 of the top-level FET(s) (also referred to herein as 'top-level FET channel layer 304') is first formed over the sacrificial gates 104/gate spacers 204 and ILD 208. See FIG. 3A (an X-X' cross-sectional view) and FIG. 3B (a Y-Y' cross-sectional view). Top-level FET channel layer 304 is formed from a semiconductor material. Suitable semiconductor materials for the top-level FET channel layer 304 include, but are not limited to, Si, Ge, SiGe and/or a III-V semiconductor. According to an exemplary embodiment, top-level FET channel layer 304 is formed over the sacrificial gates 104/gate spacers 204 and ILD 208 using a wafer bonding technique. By way of example only, with wafer bonding a semiconductor (e.g., Si, Ge, SiGe and/or a III-V semiconductor) wafer is bonded to substrate 202 using dielectric-to-dielectric bonding (forming bonded dielectric 302), followed by thinning of the semiconductor, leaving the remaining semiconductor substrate as the top-level FET channel layer 304. Wafer-bonding processes are well-known in the art, and thus are not described in further detail herein. In one exemplary embodiment, the top-level FET channel layer 304 is formed having a thickness of from about 5 nanometers (nm) to about 100 nm and ranges therebetween. Suitable materials for the bonded dielectric 302 include, but are not limited to, oxide materials such as SiOx.

Figure 4:
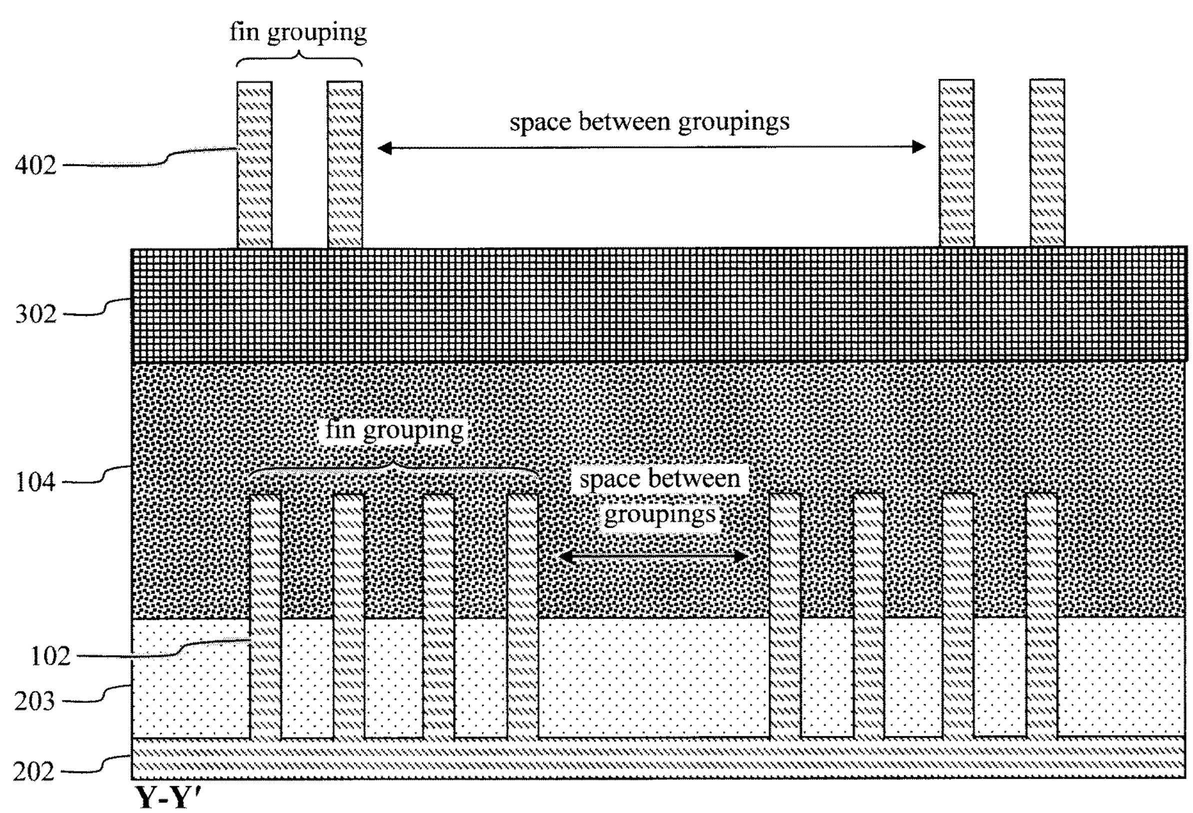
FIG. 4 is a Y-Y' cross-sectional view illustrating top-level FET fins having been patterned in the top-level FET channel layer according to an embodiment of the present invention.
Figure 5A:
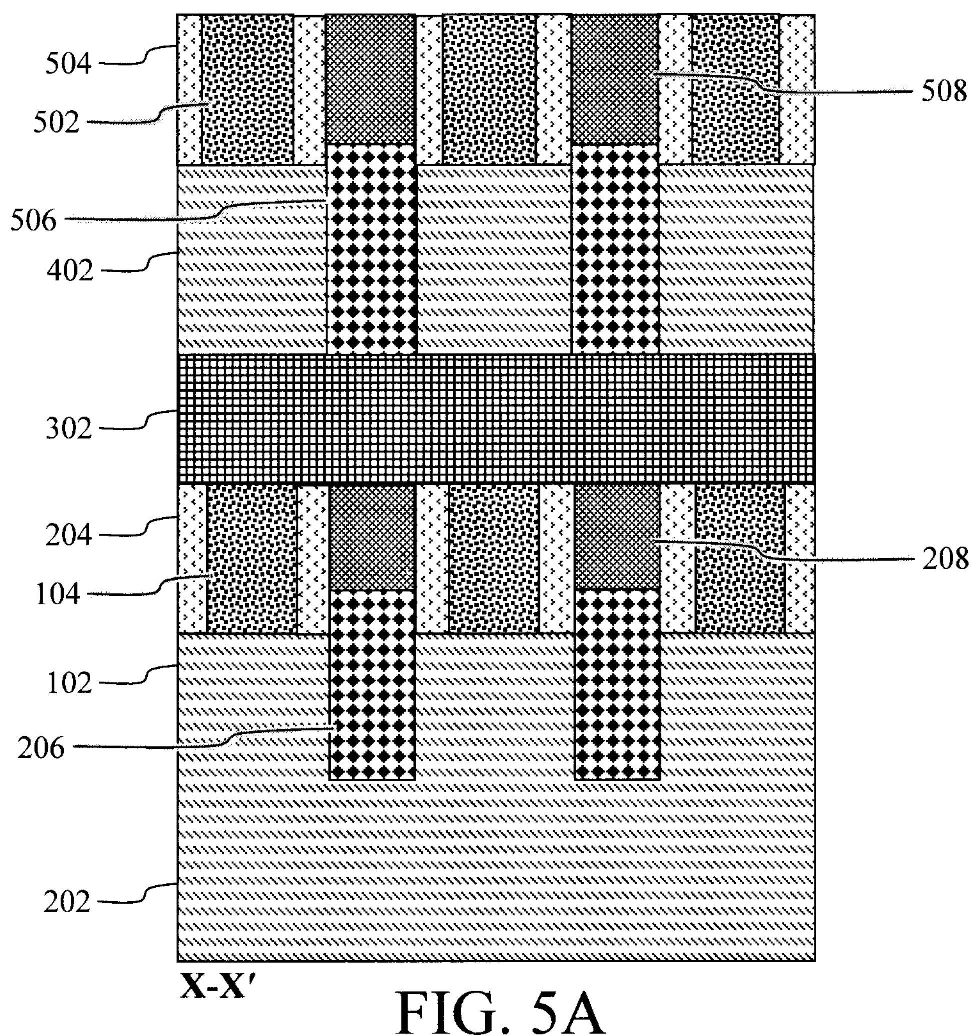
FIG. 5A is an X-X' cross-sectional view illustrating top-level FET(s) with (second) sacrificial gates having been formed on the top-level FET fins.
Figure 5B:
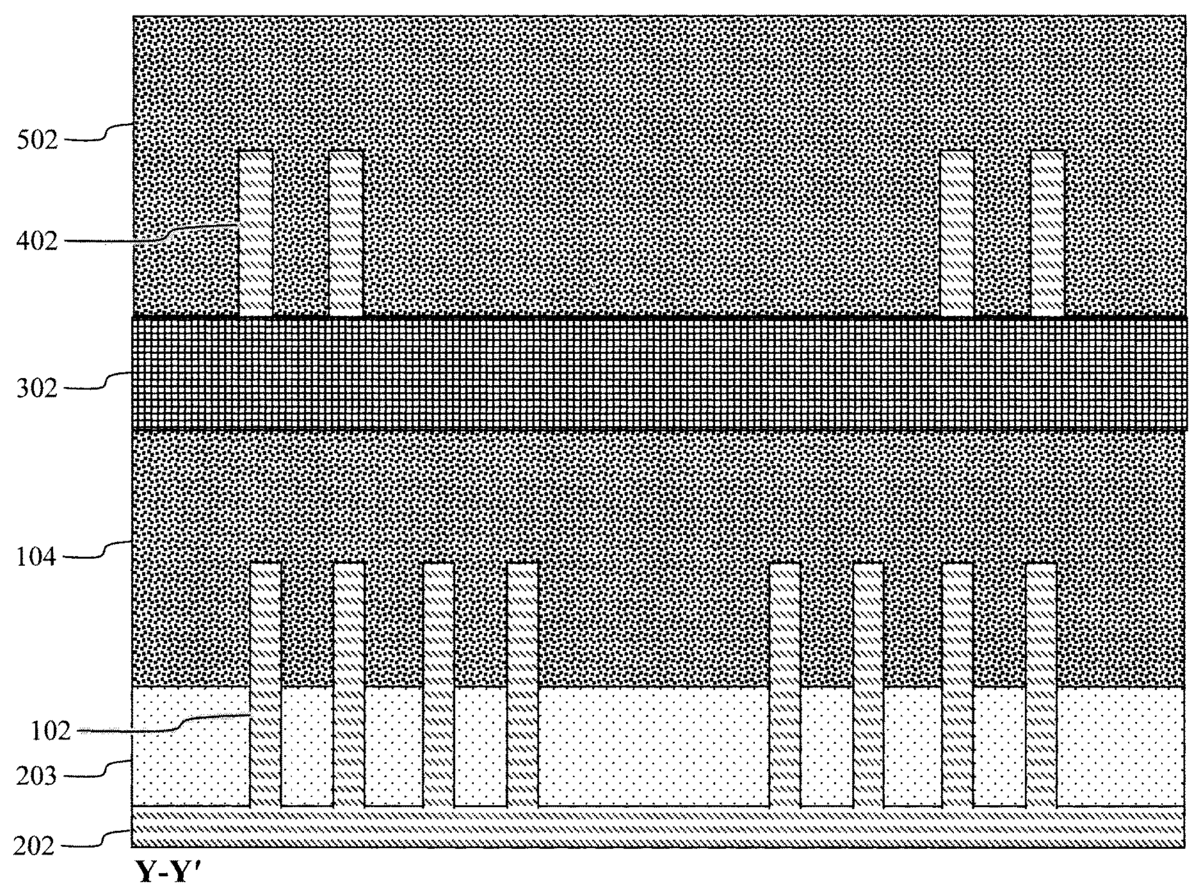
FIG. 5B is a Y-Y' cross-sectional view illustrating the top-level FET(s) with the second sacrificial gates having been formed on the top-level FET fins according to an embodiment of the present invention.

Fins 402 for the top-level FET(s) (also referred to herein as 'top-level FET fins 402') are then patterned in the top-level FET channel layer 304. See FIG. 4 (a Y-Y' cross-sectional view). Standard lithography and etching techniques (see above) can be employed to pattern the top-level FET fins 402 in the top-level FET channel layer 304. As shown in FIG. 4, the placement and/or number of the top-level FET fins 402 can vary from that of the bottom-level FET fins 102. For instance, in the present, non-limiting example there are fewer top-level FET fins 402 than bottom-level FET fins 102 (e.g., there are two groupings of the top-level FET fins 402 each grouping having two fins, while there are two groupings of the bottom-level FET fins 102 each grouping having four fins, and the groupings of the top-level FET fins 402 are spaced apart from one another by a greater distance than the bottom-level FET fins 102). As will be described in detail below, this configuration of the bottom-level FET fins 102/top-level FET fins 402 will enable the formation of a bottom gate access opening between the groupings of the top-level FET fins 402.

The above-described process is then repeated to form one or more sacrificial gates 502 on the top-level FET fins 402, gate spacers 504 on opposite sides of the sacrificial gates 502, and source/drain regions 506 of the top-level FET(s) (also referred to herein as 'top-level FET source/drain regions 506') in the top-level FET fins 402 on opposite sides of the sacrificial gates 502. See FIG. 5A (an X-X' cross-sectional view) and FIG. 5B (a Y-Y' cross-sectional view). For clarity, the terms 'first' and 'second' may also be used herein when referring to sacrificial gates 104 and sacrificial gates 502, respectively.

As above, suitable materials for the sacrificial gates 502 include, but are not limited to, poly-Si and/or a-Si which can be deposited onto the top-level FET fins 402 using a process such as CVD, ALD or PVD. Standard lithography and etching techniques (see above) can then be employed to pattern the sacrificial gate material into the individual sacrificial gates 502 shown in FIGS. 5A and 5B.

As above, suitable materials for the gate spacers 504 include, but are not limited to, oxide spacer materials such as SiOx and/or SiOC and/or nitride spacer materials such as SiN, SiBCN and/or SiOCN which can be deposited over the sacrificial gates 502 using a process such as CVD, ALD or PVD. A directional (i.e., anisotropic) etching process such as RIE can then be employed to pattern the spacer material into the individual gate spacers 504 shown in FIG. 5A along the sidewalls of the sacrificial gates 502.

Gate spacers 504 offset the sacrificial gates 502 from the top-level FET source/drain regions 506. According to an exemplary embodiment, the top-level FET source/drain regions 506 are formed from an in-situ doped (i.e., where a dopant(s) is introduced during growth) or ex-situ doped (e.g., where a dopant(s) is introduced by ion implantation) epitaxial material such as epitaxial Si, epitaxial SiGe, etc. As provided above, suitable n-type dopants include, but are not limited to, P and/or As, and suitable p-type dopants include, but are not limited to, B.

An ILD 508 is then deposited over the top-level FET source/drain regions 506 and burying the sacrificial gates 502/gate spacers 504. For clarity, the terms 'first' and 'second' may also be used herein when referring to ILD 208 and ILD 508, respectively. Suitable materials for ILD 508 include, but are not limited to, oxide materials such as SiOx and/or SiCOH and/or ULK-ILD materials such as pSiCOH. A process such as CVD, ALD, or PVD can be used to deposit the ILD 508. Following deposition, the ILD 508 is polished down to the top surface of the sacrificial gates 502 using a process such as CMP.

Figure 6:
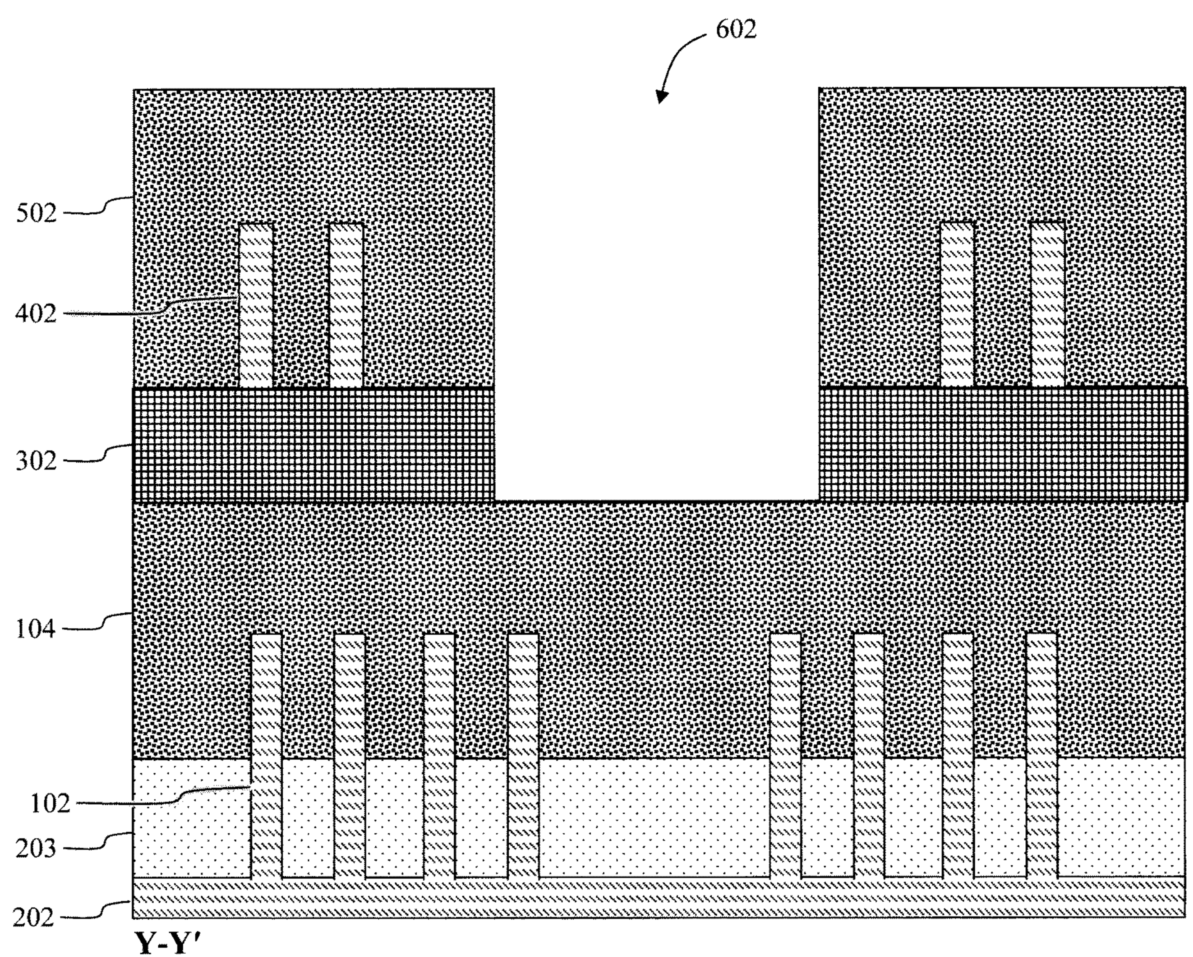
FIG. 6 is a Y-Y' cross-sectional view illustrating a bottom gate access opening having been formed through the second sacrificial gates down to the first sacrificial gates according to an embodiment of the present invention.
Figure 7:
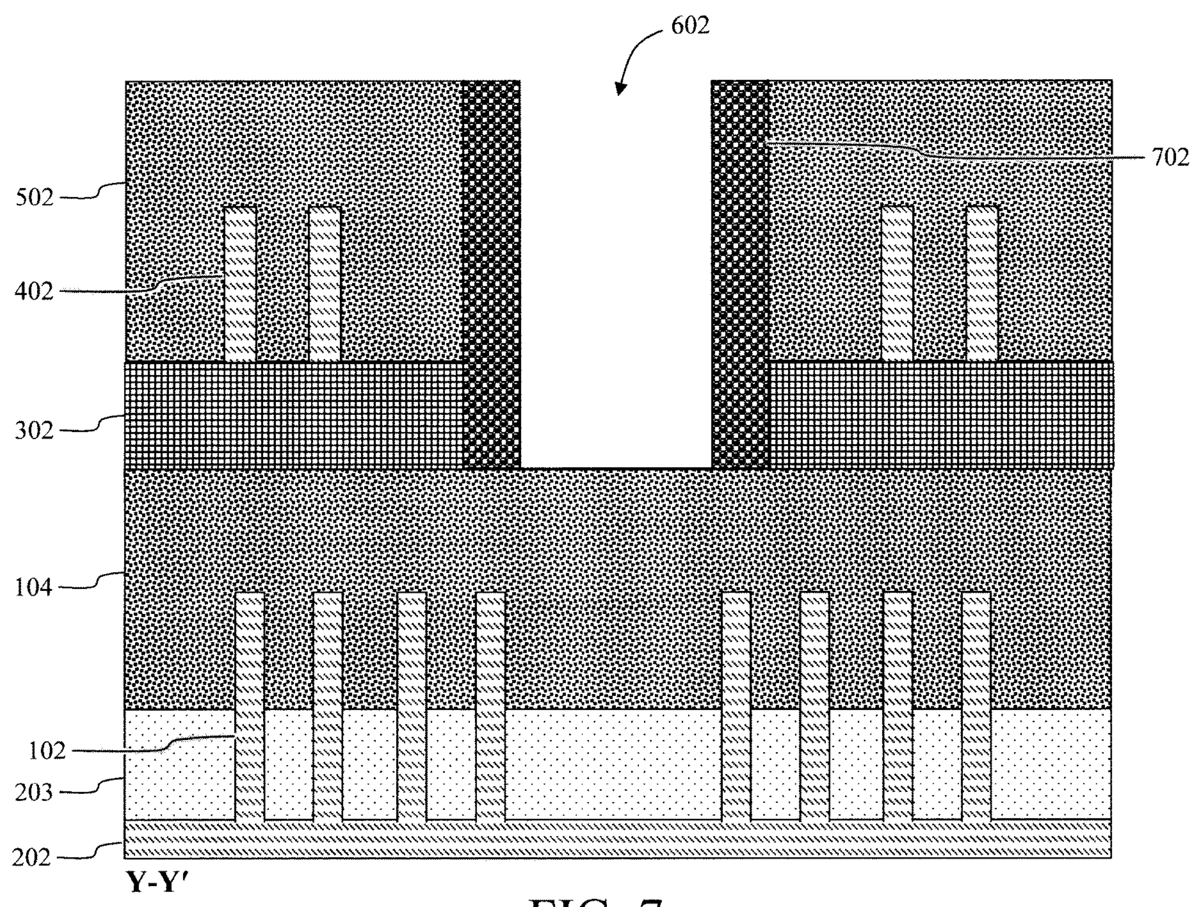
FIG. 7 is a Y-Y' cross-sectional view illustrating dielectric sidewall spacers having been formed along the sidewalls of the bottom gate access opening according to an embodiment of the present invention.
Figure 8A:
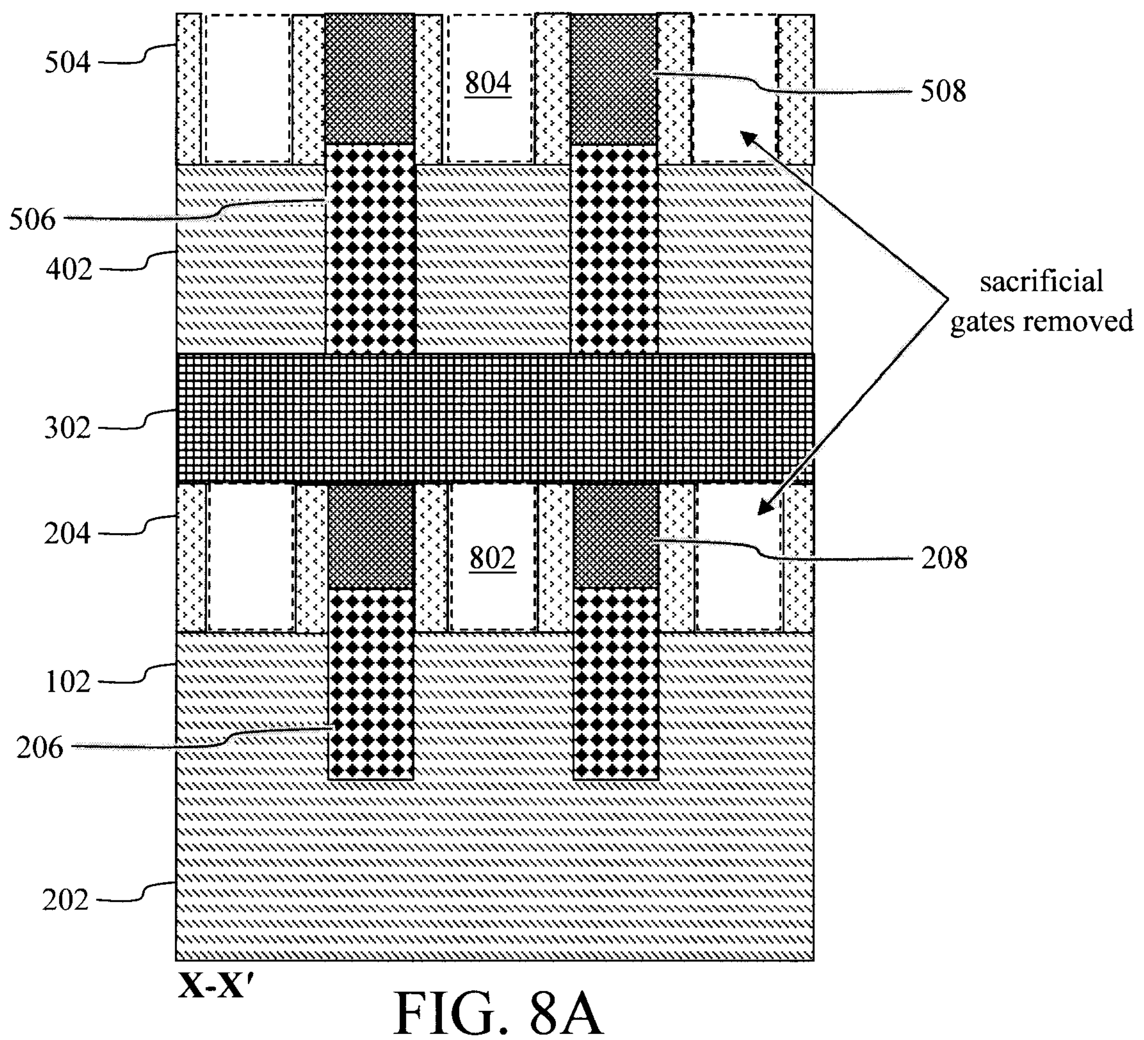
FIG. 8A is an X-X' cross-sectional view illustrating the first/second sacrificial gates having been selectively removed forming first/second gate trenches in the bottom/top-level FET devices.
Figure 8B:
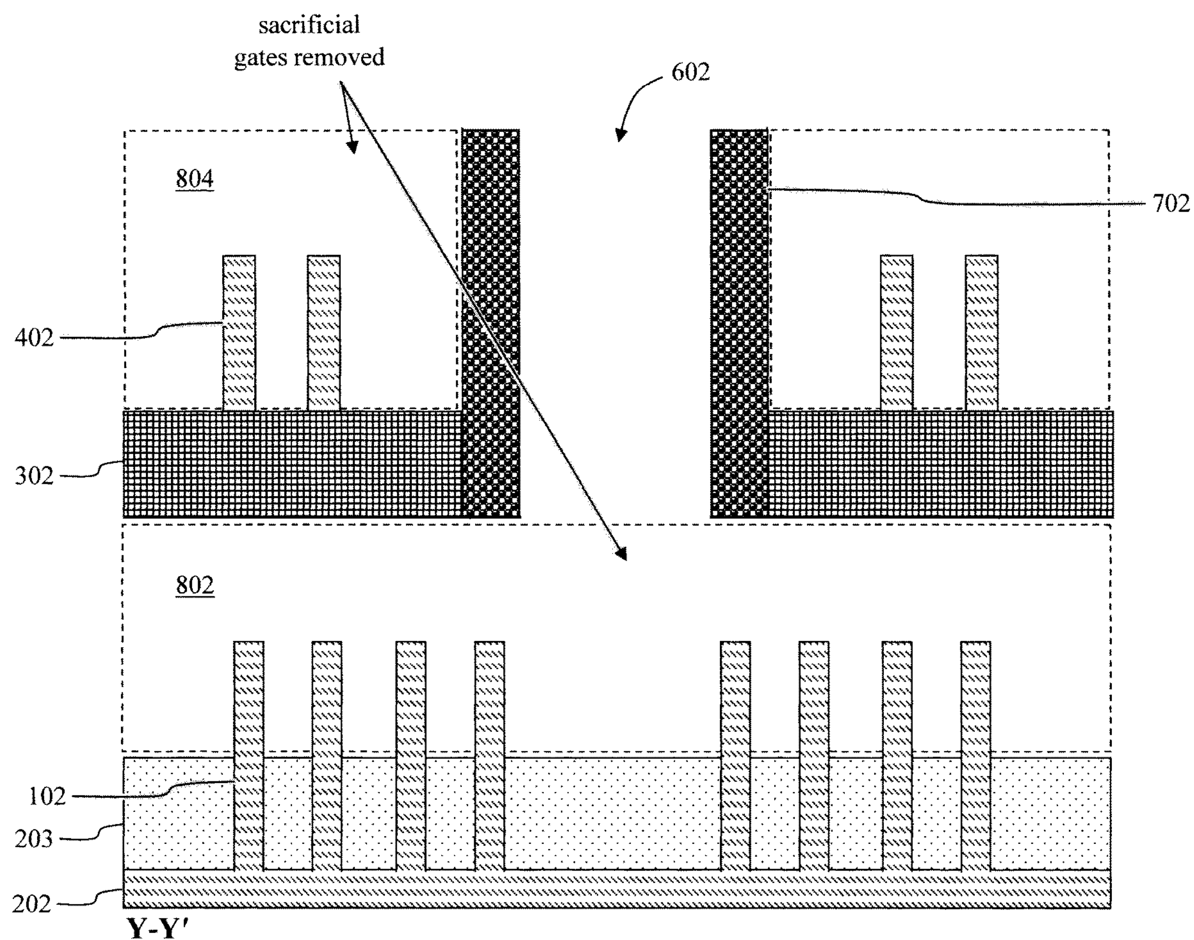
FIG. 8B is a Y-Y' cross-sectional view illustrating the first/second sacrificial gates having been selectively removed forming the first/second gate trenches in the bottom/top-level FET devices according to an embodiment of the present invention.

Standard lithography and etching techniques (see above) are then used to pattern a bottom gate access opening 602 in between the groupings of the top-level FET fins 402. See FIG. 6 (a Y-Y' cross-sectional view). As shown in FIG. 6, bottom gate access opening 602 extends through the sacrificial gates 502 and bonded dielectric 302, down to the sacrificial gates 104. By way of example only, bottom gate access opening 602 can be formed using a standard lithography process followed by a directional (i.e., anisotropic) etching process such as RIE. For instance, a poly-Si or a-Si selective RIE can be employed to pattern the bottom gate access opening 602 in the sacrificial gates 502, followed by an oxide-selective RIE to pattern the bottom gate access opening 602 in the bonded dielectric 302 (stopping on the underlying the sacrificial gates 104).

Dielectric sidewall spacers 702 are then formed along the sidewalls of the bottom gate access opening 602. See FIG. 7 (a Y-Y' cross-sectional view). Suitable dielectric materials for the dielectric sidewall spacers 702 include, but are not limited to, silicon oxycarbide (SiCO) and/or silicon carbide (SiC) which can be deposited into and lining the bottom gate access opening 602 using a process such as CVD, ALD, or PVD. A directional (i.e., anisotropic) etching process such as RIE can then be employed to pattern the deposited spacer material into the individual dielectric sidewall spacers 702 shown in FIG. 7. As will be described in detail below, the dielectric sidewall spacers 702 will be opened selective to a dielectric gate cap (see below) to form a shared gate contact for the stacked FET device.

As provided above, the gate-last approach employed herein involves the removal and replacement of the sacrificial gates with the final, i.e., replacement, gates of the stacked FET device. As such, the (first) sacrificial gates 104 and (second) sacrificial gates 502 are next selectively removed from the FET device structure forming first/second gate trenches 802/804 in the bottom/top-level FET devices, respectively. See FIG. 8A (an X-X' cross-sectional view) and FIG. 8B (a Y-Y' cross-sectional view) where dashed lines are used to depict removal of the sacrificial gates 104 and 502. By way of example only, sacrificial gates 104 and 502 can be removed using a non-directional (i.e., isotropic) etching process such as a (e.g., poly-Si and/or a-Si selective) wet chemical etch or gas phase etch.

First and second replacement gates 902 and 904 are then formed in gate trenches 802/bottom gate access opening 602 and in gate trenches 804, respectively. See FIG. 9A (an X-X' cross-sectional view) and FIG. 9B (a Y-Y' cross-sectional view). As shown in magnified views 920A/922A (FIG. 9A) and magnified views 920B/922B (FIG. 9B), according to an exemplary embodiment, each of the first/second replacement gates 902 and 904 includes a gate dielectric 906 and a gate conductor 908 disposed on the gate dielectric 906. Although not explicitly shown, a thin (e.g., from about 0.3 nm to about 5 nm) interfacial oxide (e.g., silicon oxide (SiOx) which may include other chemical elements in it such as nitrogen (N), germanium (Ge), etc.) can first be formed on exposed surfaces of the bottom- and top-level FET fins 102 and 402, and the gate dielectric 906 can then be deposited over the interfacial oxide using a process such as CVD, ALD, or PVD.

Suitable materials for the gate dielectric 906 include, but are not limited to, silicon oxide (SiOx), SiN, silicon oxynitride (SiOxNy), high-κ materials, or any combination thereof. The term "high-κ" as used herein refers to a material having a relative dielectric constant κ which is much higher than that of silicon dioxide (e.g., a dielectric constant κ is about 25 for hafnium oxide ($HfO_2$) rather than 3.9 for $SiO_2$). Suitable high-κ materials include, but are not limited to, metal oxides such as $HfO_2$, hafnium silicon oxide (HfSiO), hafnium silicon oxynitride (HfSiO), lanthanum oxide ($La_2O_3$), lanthanum aluminum oxide ($LaAlO_3$), zirconium oxide ($ZrO_2$), zirconium silicon oxide ($ZrSiO_4$), zirconium silicon oxynitride (ZrSiOxNy), tantalum oxide (TaOx), titanium oxide (TiO), barium strontium titanium oxide ($BaO_6SrTi_2$), barium titanium oxide ($BaTiO_3$), strontium titanium oxide ($SrTiO_3$), yttrium oxide ($Y_2O_3$), aluminum oxide ($Al_2O_3$), lead scandium tantalum oxide ($Pb(Sc,Ta)O_3$) and/or lead zinc niobite (Pb(Zn,Nb)O). The high-κ material can further include dopants such as lanthanum (La), aluminum (Al) and/or magnesium (Mg). The gate dielectric 906 can be deposited using a process or combination of processes such as, but not limited to, thermal oxidation, chemical oxidation, thermal nitridation, plasma oxidation, plasma nitridation, CVD, ALD, etc. According to an exemplary embodiment, the gate dielectric 906 has a thickness of from about 1 nm to about 5 nm and ranges therebetween.

Suitable materials for the gate conductor 908 include, but are not limited to, doped polysilicon and/or at least one workfunction-setting metal. Suitable workfunction-setting metals include, but are not limited to, titanium nitride (TiN), titanium aluminum nitride (TiAlN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN), titanium carbide (TiC) titanium aluminum carbide (TiAlC), tantalum carbide (TaC) and/or hafnium carbide (HfC). The gate conductor 908 can be deposited using a process or combination of processes such as, but not limited to, CVD, ALD, PVD, sputtering, plating, evaporation, ion beam deposition, electron beam deposition, laser assisted deposition, chemical solution deposition, etc. According to an exemplary embodiment, the gate conductor 908 has a thickness of from about 5 nm to about 15 nm and ranges therebetween. In the exemplary embodiment shown illustrated in FIGS. 9A and 9B, the gate conductor 908 includes at least one layer 908*a* of the above workfunction-setting metal(s) and a (low-resistance) fill metal 908*b* disposed over the layer(s) 908*a* of workfunction-setting metal(s) so as to fill in any remaining space in the replacement gates 902 and 904. Suitable low-resistance fill metals include, but are not limited to, tungsten (W) and/or aluminum (Al) which can be deposited using a process or combination of processes such as, but not limited to, CVD, ALD, PVD, sputtering, plating, evaporation, ion beam deposition, electron beam deposition, laser assisted deposition, chemical solution deposition, etc.

Figure 9A:
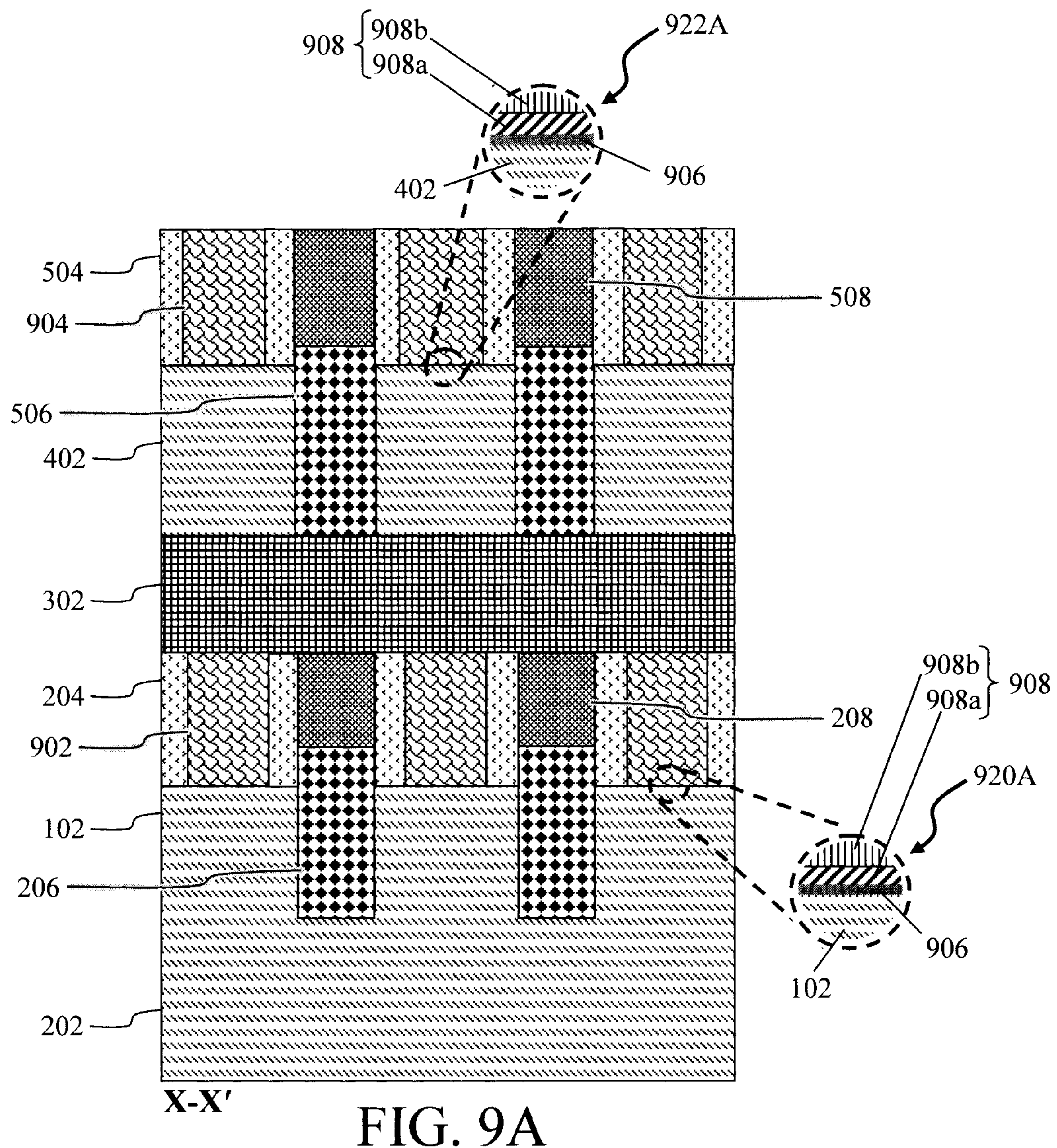
FIG. 9A is an X-X' cross-sectional view illustrating first and second replacement gates having been formed in the first gate trenches/bottom gate access opening and in the second gate trenches.
Figure 9B:
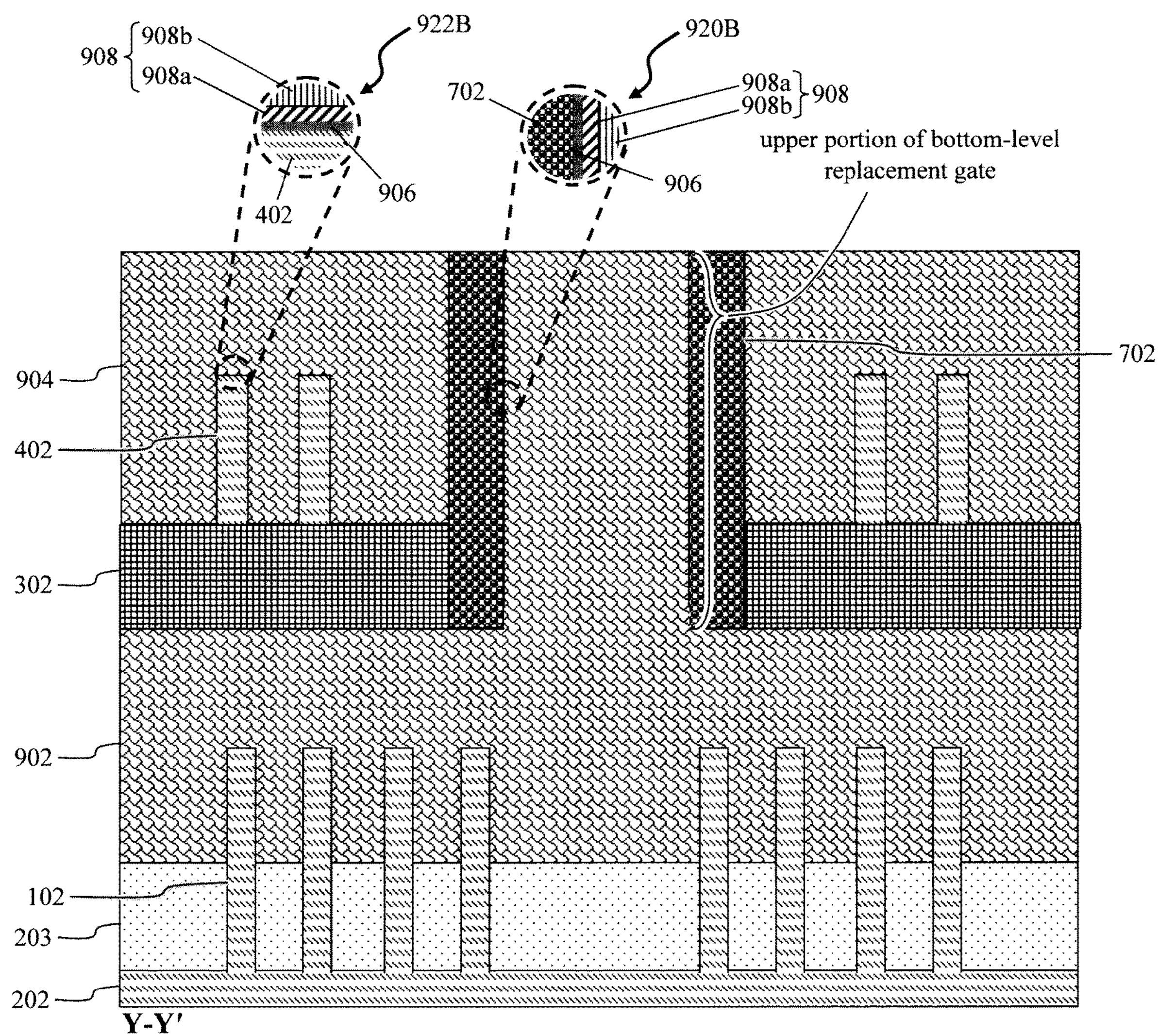
FIG. 9B is a Y-Y' cross-sectional view illustrating the first and second replacement gates having been formed in the first gate trenches/bottom gate access opening and in the second gate trenches according to an embodiment of the present invention.

Based on the above-described process for forming the first/second replacement gates 902 and 904 in the gate trenches 802/bottom gate access opening 602 and in gate trenches 804, respectively, the replacement gate 902 will have an upper portion thereof (i.e., the portion of replacement gate 902 formed in the bottom gate access opening 602) that is adjacent to the replacement gate 904. See FIG. 9B. As shown in FIG. 9B, the dielectric sidewall spacers 702 are present between that upper portion of the replacement gate 902 and the replacement gate 904. Notably, the dielectric sidewall spacers 702 prevent any undercut of the workfunction-setting metal(s) due to an excessive workfunction-setting metal removal process during patterning of the workfunction-setting metal(s) for the top- and bottom-level FET devices, thus advantageously making patterning between the replacement gates 902 and 904 easier.

Figure 10A:
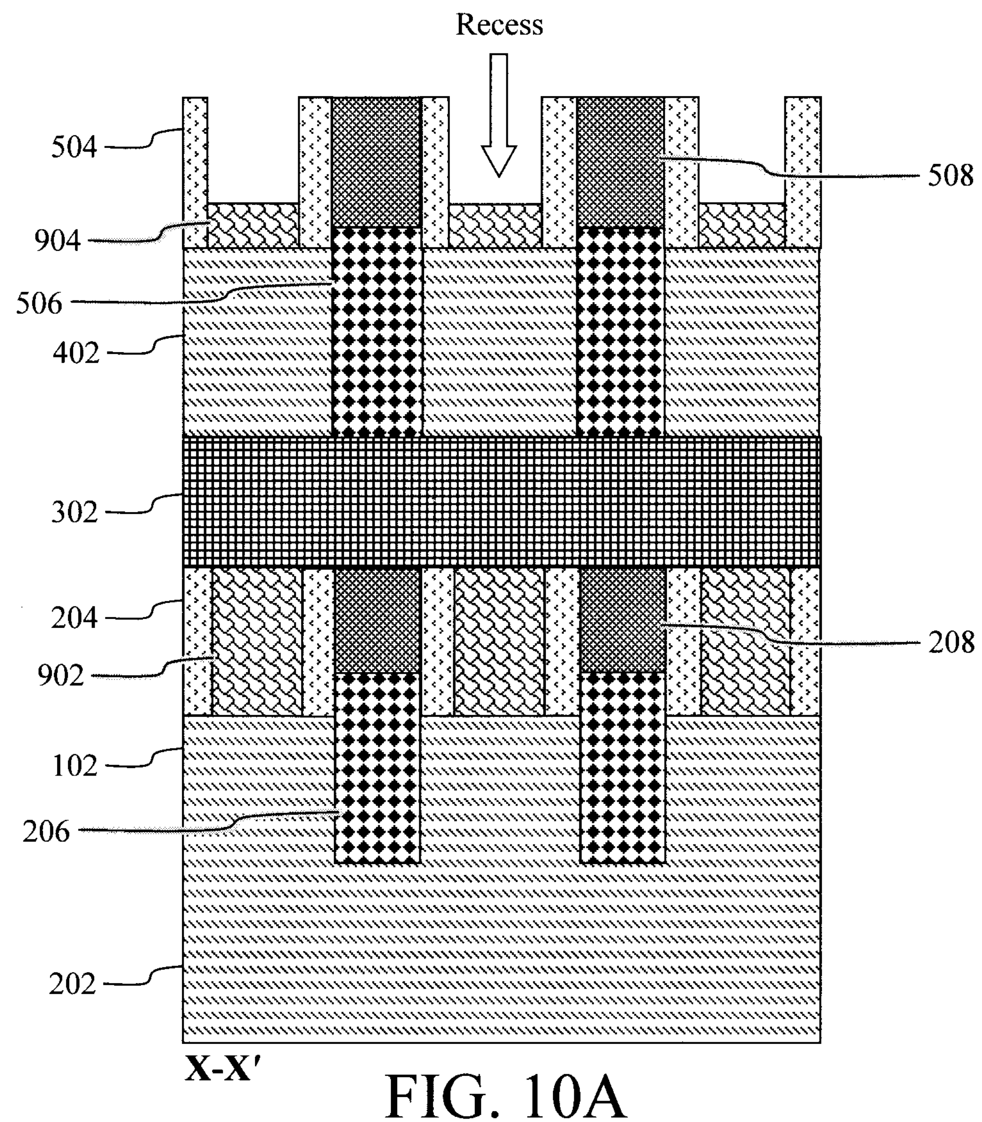
FIG. 10A is an X-X' cross-sectional view illustrating the first and second replacement gates having been recessed.
Figure 10B:
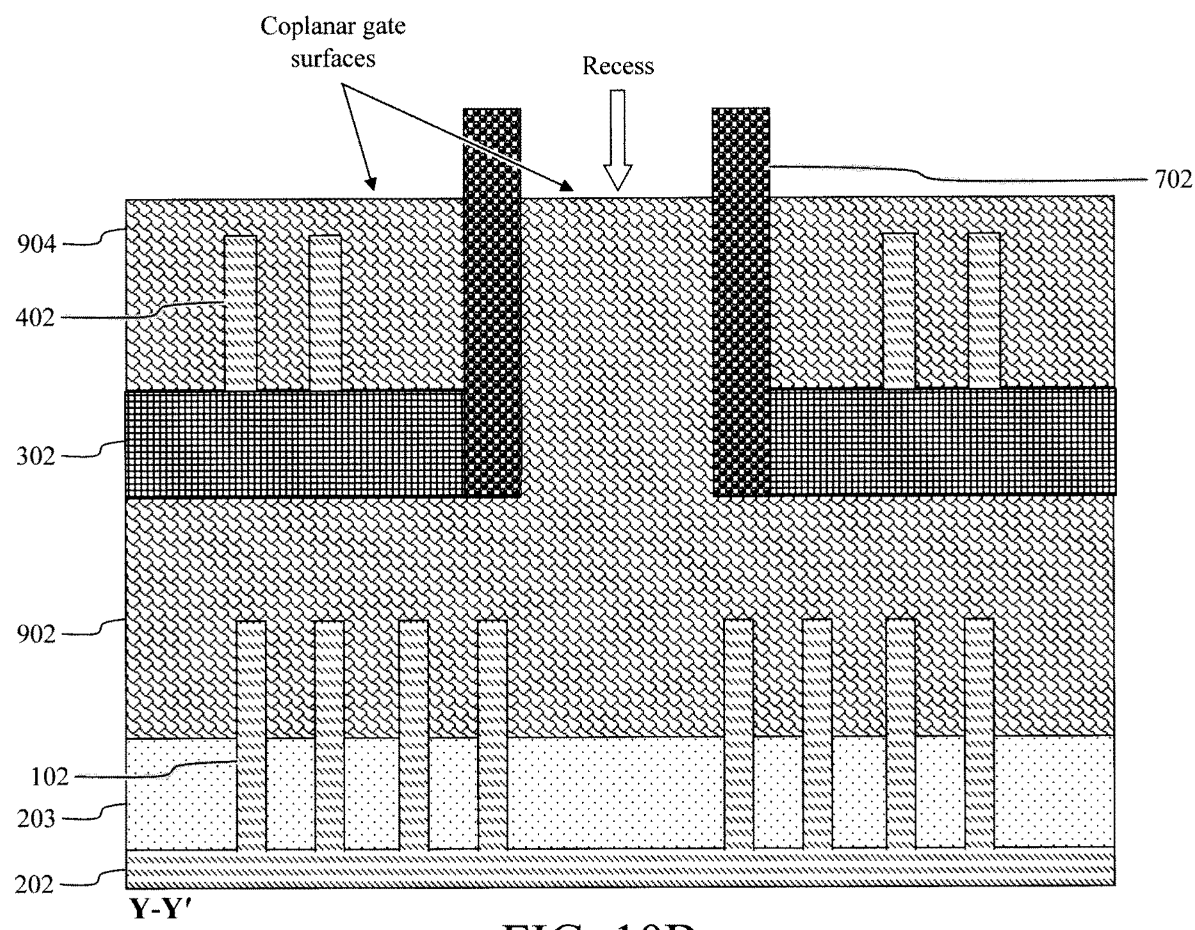
FIG. 10B is a Y-Y' cross-sectional view illustrating the first and second replacement gates having been recessed according to an embodiment of the present invention.
Figure 11A:
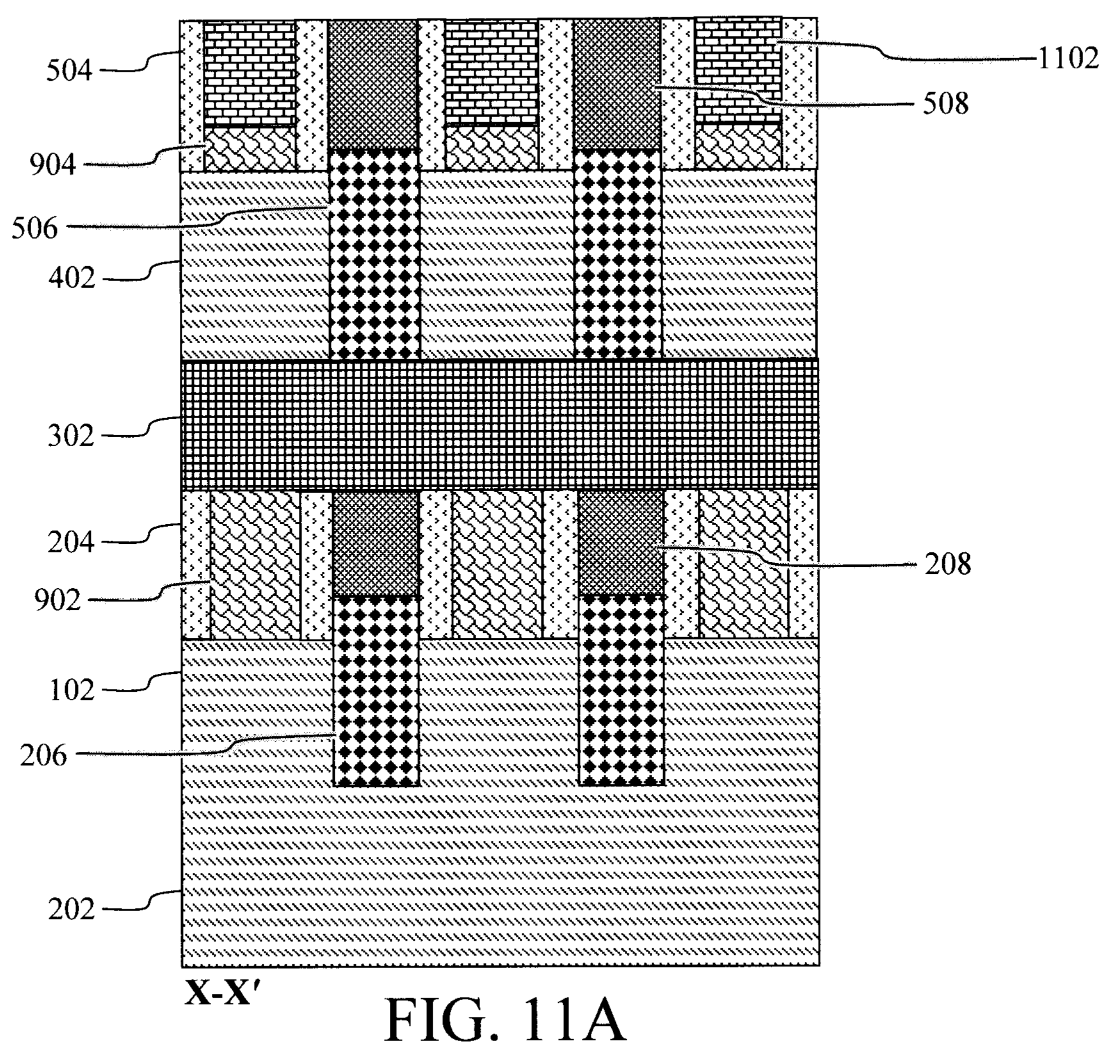
FIG. 11A is an X-X' cross-sectional view illustrating a dielectric gate cap having been formed on the (recessed) first/second replacement gates.
Figure 11B:
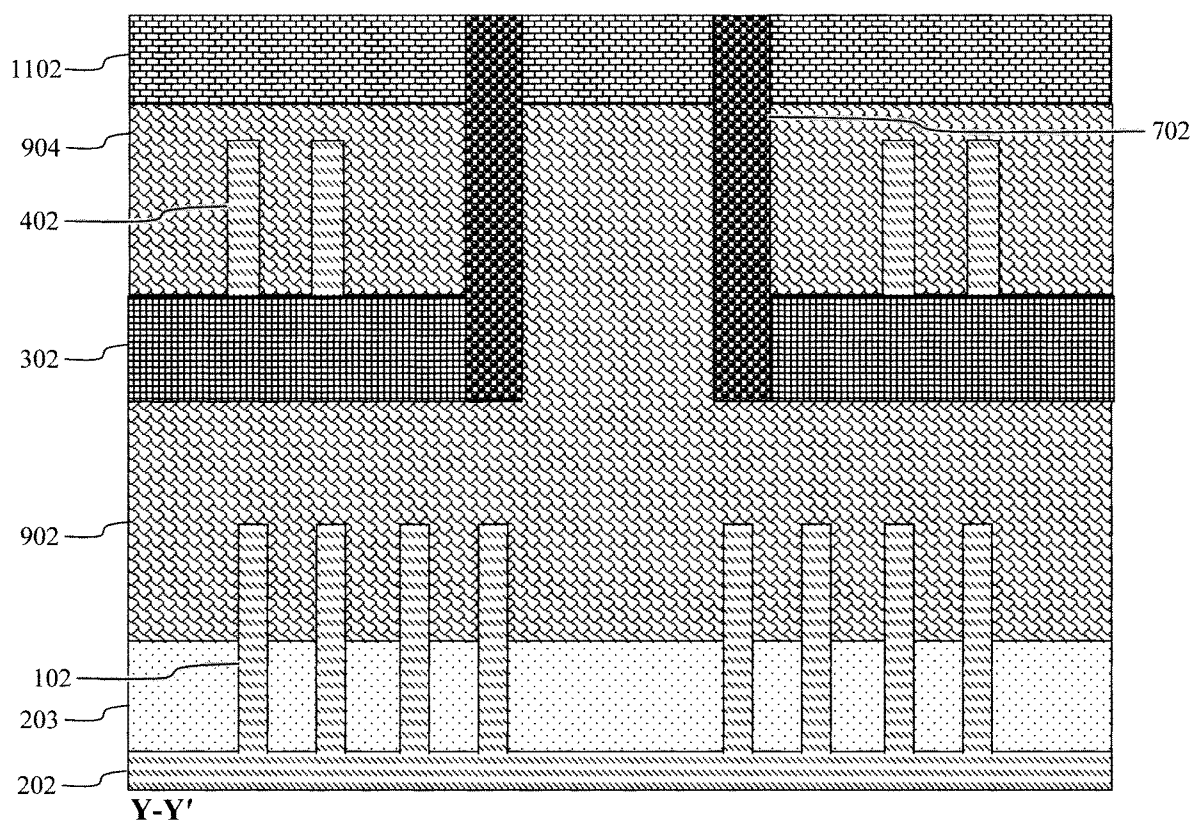
FIG. 11B is a Y-Y' cross-sectional view illustrating the dielectric gate cap having been formed on the (recessed) first/second replacement gates according to an embodiment of the present invention.

Following deposition of the gate dielectric 906 and gate conductor 908, the overburden is removed using a process such as CMP. An etch is then performed to recess the replacement gates 902 and 904. See FIG. 10A (an X-X' cross-sectional view) and FIG. 10B (a Y-Y' cross-sectional view). Doing so will enable the formation of a dielectric gate cap over the replacement gates 902 and 904 (see below). A selective etching process such as a selective RIE or wet etch can be employed for the recess etch of the replacement gates 902 and 904. As shown in FIGS. 10A and 10B, the top surfaces of the (recessed) replacement gates 902 and 904 are substantially coplanar, and are now present below the top surfaces of the gate spacers 504 and the dielectric sidewall spacers 702. By 'substantially coplanar' it is meant that the height of the top surfaces of the (recessed) replacement gates 902 and 904 differ, if at all, from one another by no more than 0.5 nm.

A dielectric gate cap 1102 is then formed on the (recessed) replacement gates 902 and 904. See FIG. 11A (an X-X' cross-sectional view) and FIG. 11B (a Y-Y' cross-sectional view). Suitable dielectric materials for the dielectric gate cap 1102 include, but are not limited to, but are not limited to, SiN, silicon oxynitride (SiON) and/or silicon carbide nitride (SiCN) which can be deposited onto the replacement gates 902 and 904 using a process such as CVD, ALD or PVD. following deposition, the dielectric gate cap material can be polished down to a top surface of the dielectric sidewall spacers 702 using a process such as CMP. According to an exemplary embodiment, the dielectric gate cap 1102 is formed having a thickness of from about 5 nm to about 15 nm and ranges therebetween.

As will be described in detail below, the dielectric gate cap 1102 will be opened selective to the dielectric sidewall spacers 702 to form an independent gate contact for the stacked FET device. The exemplary materials provided above for the dielectric sidewall spacers 702 and the dielectric gate cap 1102 enable selective etching/removal of the dielectric gate cap 1102 relative to the dielectric sidewall spacers 702, and vice versa. It is further notable that fabricating the dielectric gate cap 1102 and dielectric sidewall spacers 702 in this manner produces a unique structure whereby the dielectric sidewall spacers 702 are oriented as a vertical spacer in between and separating the replacement gates 902 and 904. Further, the tops of the dielectric sidewall spacers 702 extend through the dielectric gate cap 1102. As will be described in detail below, this will enable selective access for both the independent and shared gate contacts from the top of the stacked FET device structure.

Figure 12:
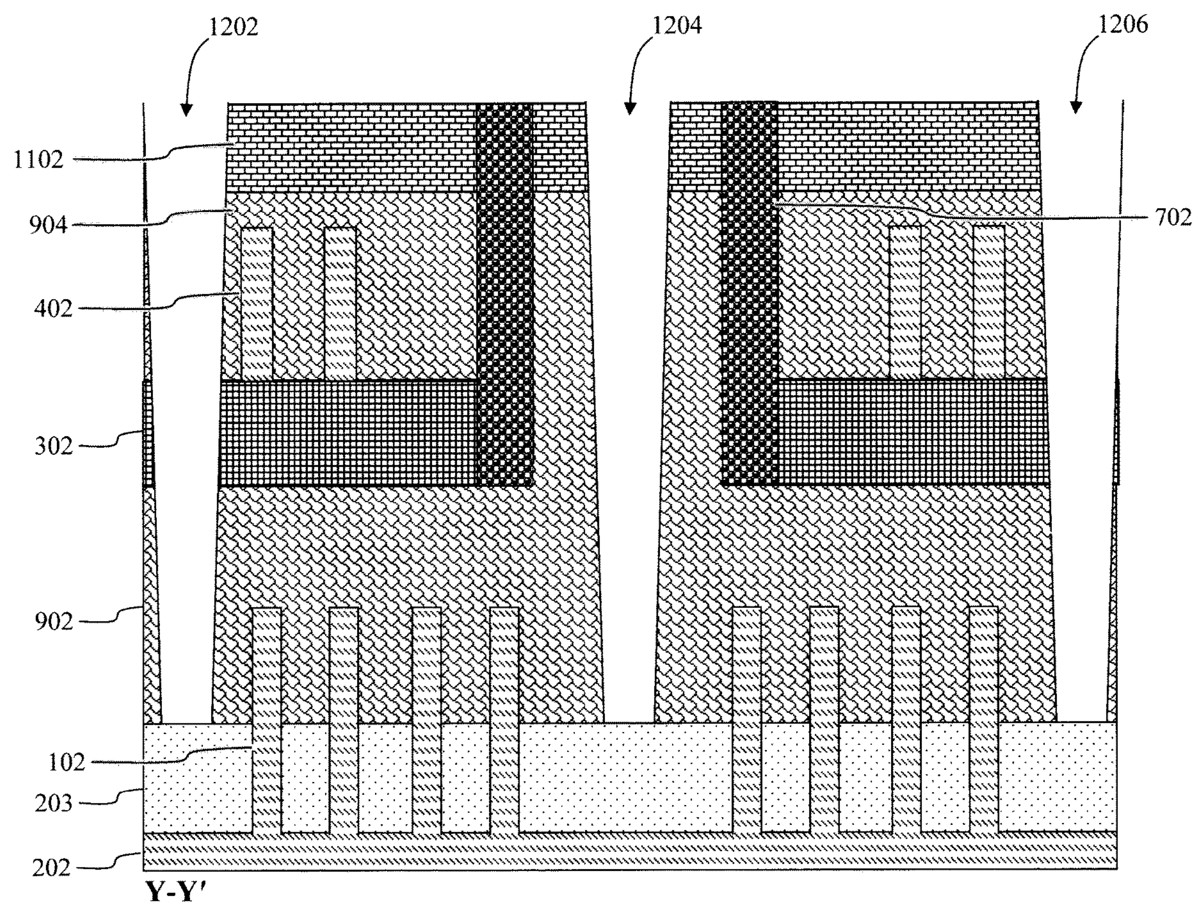
FIG. 12 is a Y-Y' cross-sectional view illustrating trenches having been formed in the first/second replacement gates according to an embodiment of the present invention.

Standard lithography and etching techniques (see above) are then employed to form trenches 1202, 1204 and 1206 in the first/second replacement gates 902 and 904. See FIG. 12 (a Y-Y' cross-sectional view). A directional (i.e., anisotropic) etching process such as RIE can be employed for the trench etch. As shown in FIG. 12, the trenches 1202 and 1206 each extend through the dielectric gate cap 1102, the replacement gates 904, the bonded dielectric 302, the replacement gates 902 and down to the STI regions 203, to left and right of the groupings of the top- and bottom-level FET fins 402 and 102, respectively. Trench 1204 extends through the dielectric gate cap 1102, the replacement gates 902 and down to the STI regions 203, in between the dielectric sidewall spacers 702 and in between the groupings of the top- and bottom-level FET fins 402 and 102. These trenches 1202, 1204 and 1206 will be filled with a dielectric material, and will serve as gate cuts to isolate individual stacked FET devices.

Namely, trenches 1202, 1204 and 1206 are next filled with a dielectric material to form dielectric gate dividers 1302, 1304 and 1306, respectively. See FIG. 13 (a Y-Y' cross-sectional view). Suitable gate cut dielectric materials include, but are not limited to, SiCO and/or SiC which can be deposited into the trenches 1202, 1204 and 1206 using a process such as CVD, ALD, or PVD. Following deposition, the gate cut dielectric material can be polished using a process such as CMP. As described above, the materials for the dielectric sidewall spacers 702 and the dielectric gate cap 1102 are chosen to enable selective etching/removal of the dielectric gate cap 1102 relative to the dielectric sidewall spacers 702, and vice versa. The same consideration is made regarding the materials chosen for the dielectric gate dividers 1302, 1304 and 1306 to enable selective etching/removal of the dielectric gate cap 1102 relative to the dielectric gate dividers 1302, 1304 and 1306. In that regard, the same dielectric material can optionally be used for both the dielectric sidewall spacers 702 and the dielectric gate dividers 1302, 1304 and 1306. However, this is not a requirement, and embodiments are contemplated herein where a different dielectric material from the dielectric sidewall spacers 702 is used for the dielectric gate dividers 1302, 1304 and 1306, as long as the materials chosen provide etch selectivity with regard to the dielectric gate cap 1102.

Figure 13:
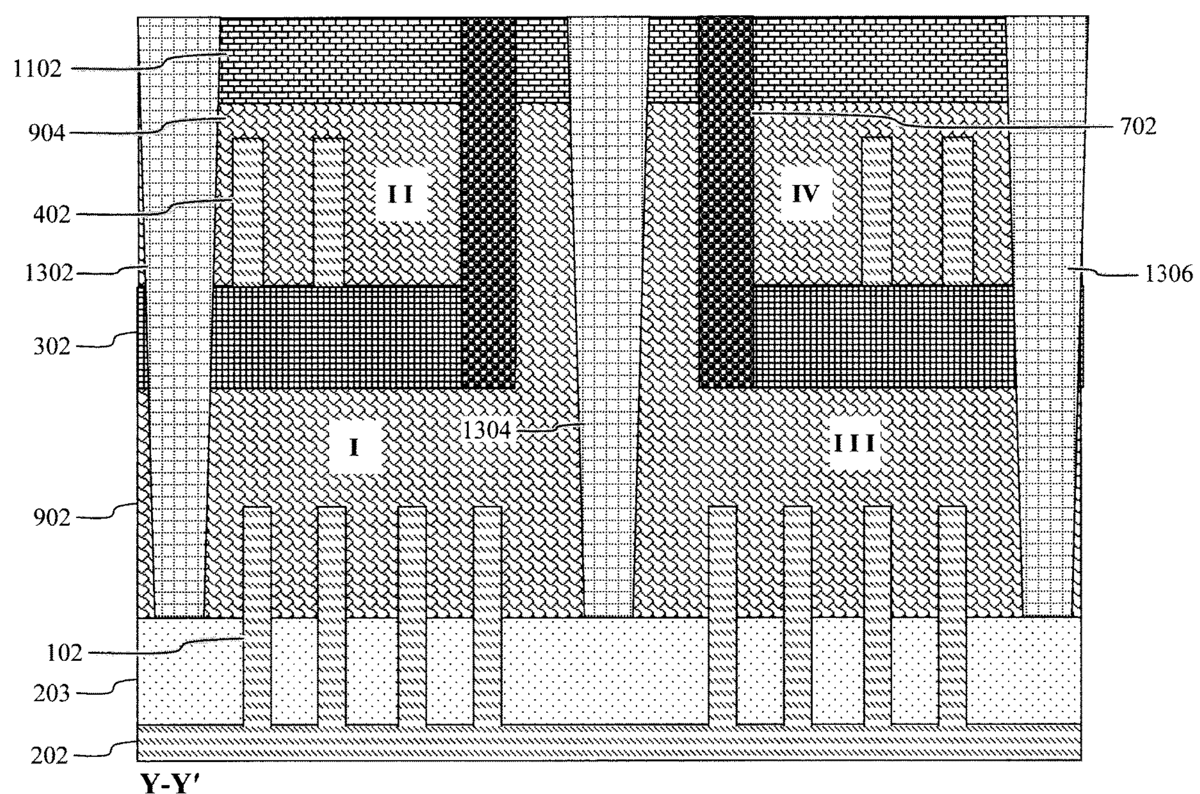
FIG. 13 is a Y-Y' cross-sectional view illustrating the trenches having been filled with a dielectric material to form dielectric gate dividers according to an embodiment of the present invention.
Figure 14A:
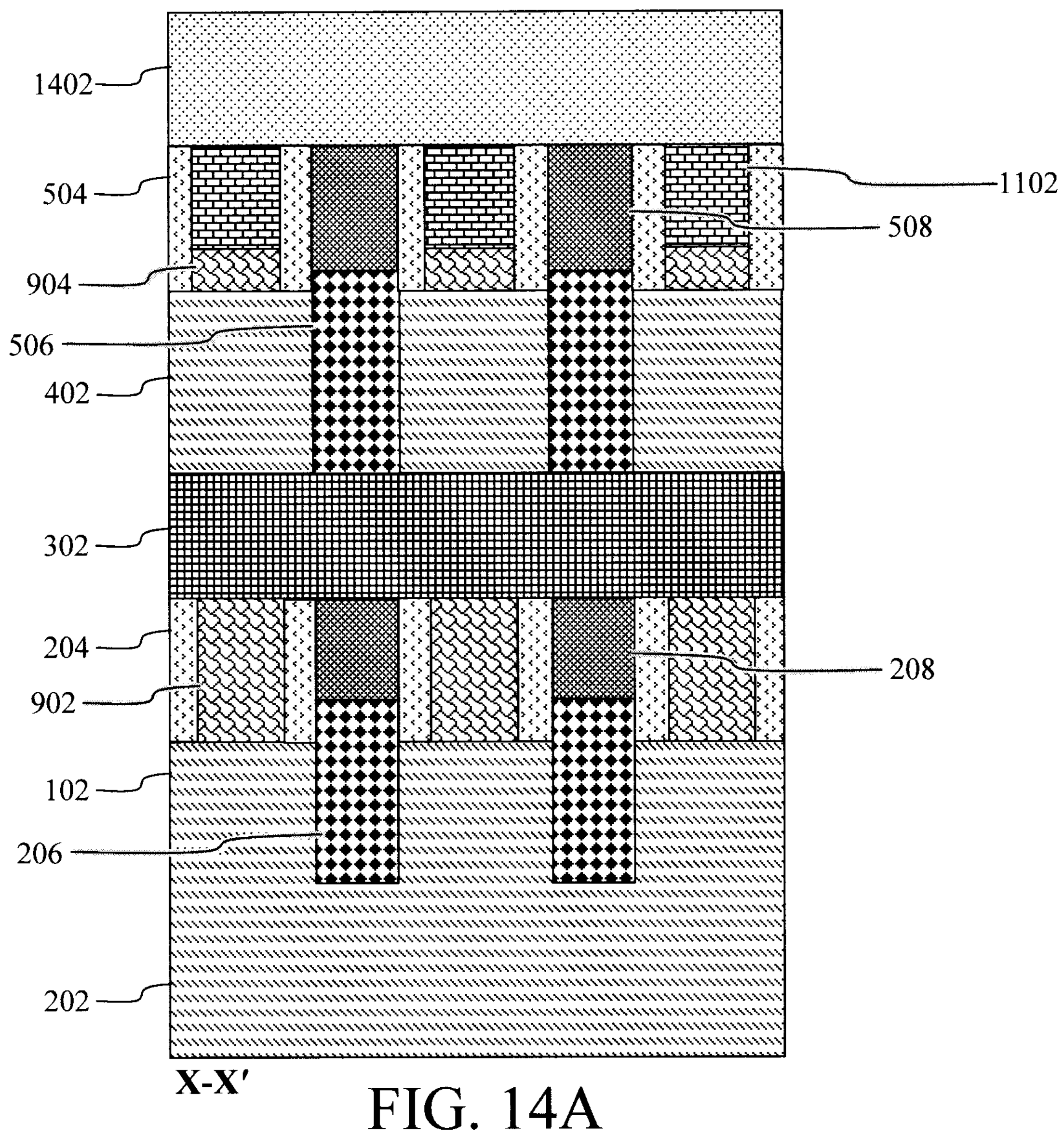
FIG. 14A is an X-X' cross-sectional view illustrating an interlayer dielectric (ILD) having been formed on the dielectric gate cap over the dielectric sidewall spacers and dielectric gate dividers.
Figure 14B:
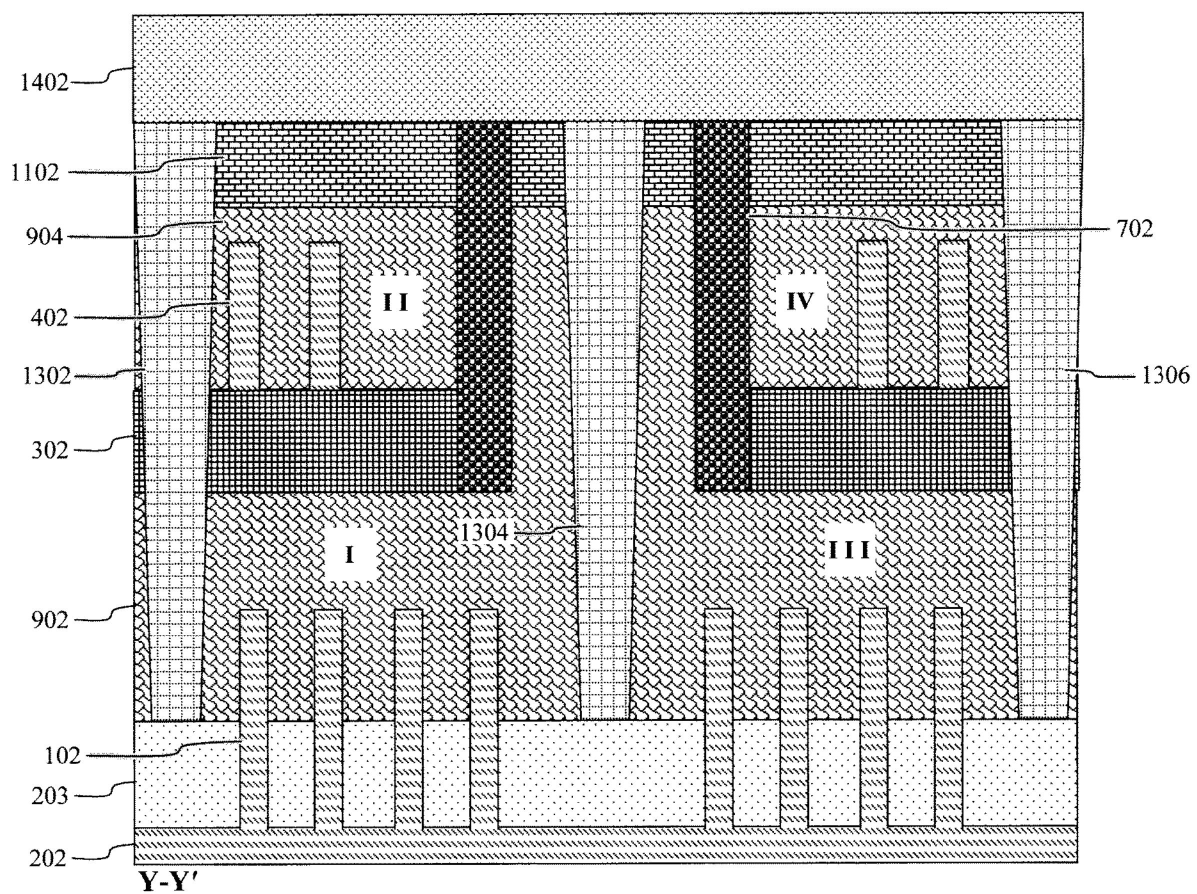
FIG. 14B is a Y-Y' cross-sectional view illustrating the ILD having been formed on the dielectric gate cap over the dielectric sidewall spacers and dielectric gate dividers according to an embodiment of the present invention.

The dielectric gate dividers 1302, 1304 and 1306 serve to isolate individual stacked FET devices. Namely, as shown in FIG. 13, in no particular order, a first stacked FET device includes a first bottom-level FET having a bottom-level FET gate I (i.e., an isolated portion of first replacement gate 902) and a first top-level FET having a top-level FET gate II (i.e., an isolated portion of the second replacement gate 904). A second stacked FET device includes a second bottom-level FET having a bottom-level FET gate III (i.e., another isolated portion of first replacement gate 902) and a second top-level FET having a top-level FET gate IV (i.e., another isolated portion of the second replacement gate 904). Dielectric gate divider 1304 serves to separate the bottom-level FET gate I (i.e., an isolated portion of first replacement gate 902) from the bottom-level FET gate III (i.e., another isolated portion of first replacement gate 902).

An ILD 1402 is then formed on the dielectric gate cap 1102 over the dielectric sidewall spacers 702 and dielectric gate dividers 1302, 1304 and 1306. See FIG. 14A (an X-X' cross-sectional view) and FIG. 14B (a Y-Y' cross-sectional view). For clarity, the term 'third' may also be used herein when referring to ILD 1402, so as to distinguish it from the 'first' ILD 208 and the 'second' ILD 508. Suitable materials for ILD 1402 include, but are not limited to, oxide materials such as SiOx and/or SiCOH and/or ULK-ILD materials such as pSiCOH. A process such as CVD, ALD, or PVD can be used to deposit the ILD 1402.

Figure 15:
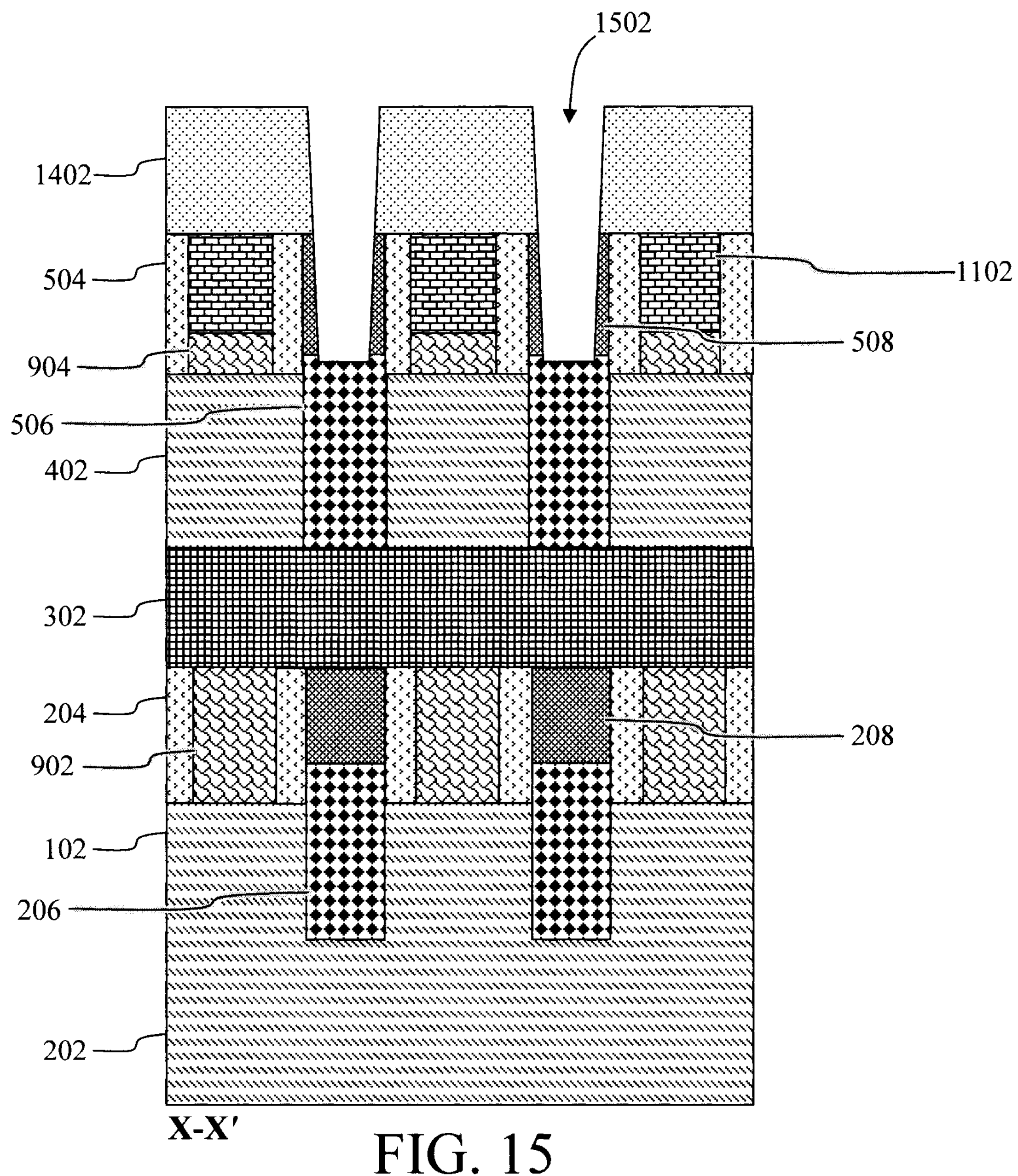
FIG. 15 is an X-X' cross-sectional view illustrating top-level FET source/drain contact openings having been formed according to an embodiment of the present invention.

Standard lithography and etching techniques (see above) are next used to form contact openings 1502 to the top-level FET source/drain regions 506 (also referred to herein as 'top-level FET source/drain contact openings 1502') in the third ILD 1402 and second ILD 508, and which extend down to the top-level FET source/drain regions 506. See FIG. 15 (a X-X' cross-sectional view). A directional (i.e., anisotropic) etching process such as RIE can be employed for the contact opening etch. As shown in FIG. 15, the contact openings 1502 are formed between adjacent gate spacers 504 to either side of the top-level FET source/drain regions 506. It is notable that, all though not visible in the depictions shown, bottom-level FET source/drain contact openings and contacts can also be formed (in the same manner described) over the bottom-level FET source/drain regions 206 where the top-level FET source/drain regions 506 do not overlap with the bottom-level FET source/drain regions 206.

In no particular order, gate contact openings are next formed for the independent and shared gate contacts of the stacked FET device. For instance, in the exemplary process flow described below, the openings for the independent gate contacts are formed prior to that for the shared gate contact. However, that sequence is arbitrary, and embodiments are contemplated herein where the opening for the shared gate contact is formed prior to those for the independent gate contacts.

Figure 16:
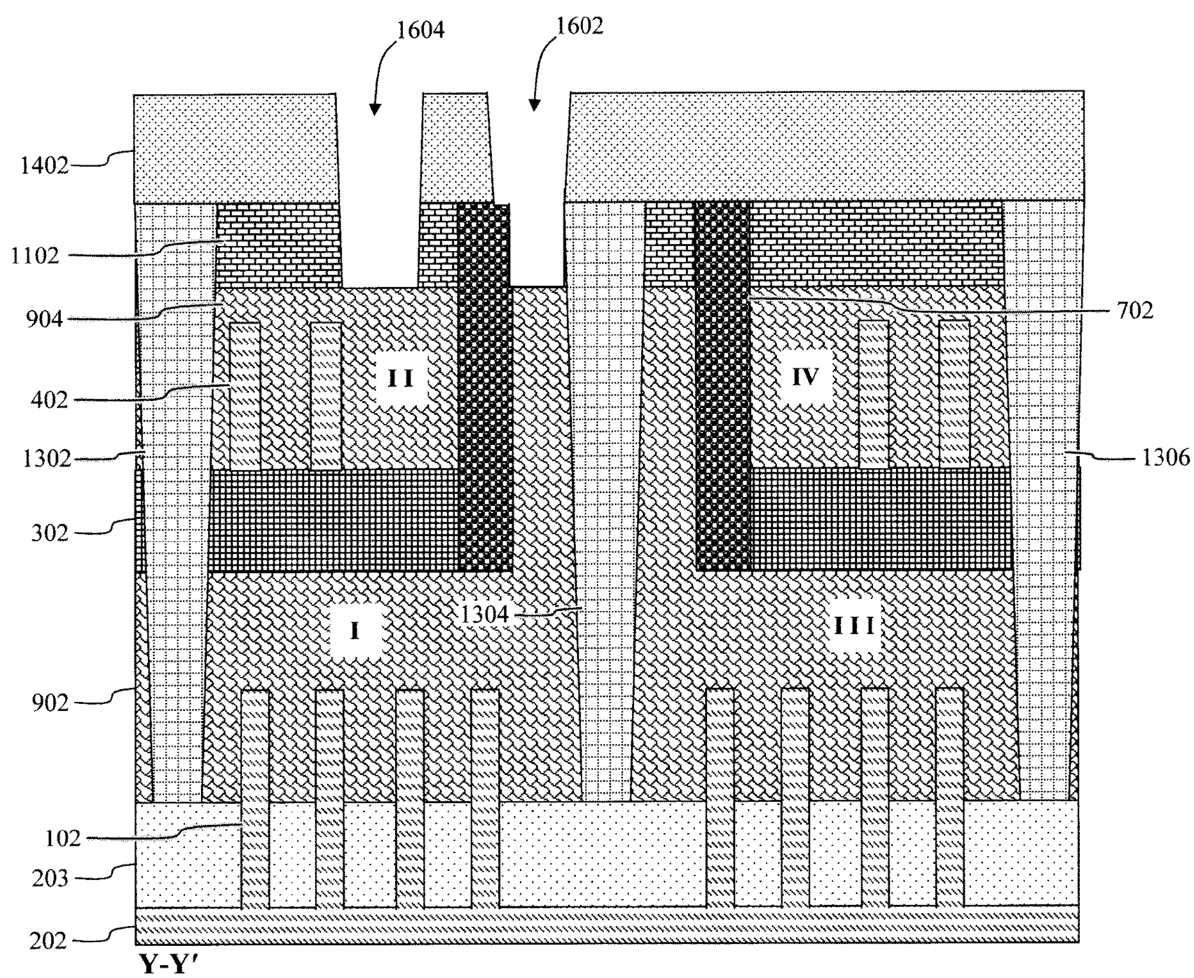
FIG. 16 is a Y-Y' cross-sectional view illustrating independent gate contact openings having been formed to an isolated portion of the first replacement gate and an isolated portion of the second replacement gate according to an embodiment of the present invention.

Thus, for example, standard lithography and etching techniques (see above) are next used to form gate contact openings 1602 and 1604 to the bottom-level FET gate I (i.e., an isolated portion of first replacement gate 902) and the top-level FET gate II (i.e., an isolated portion of the second replacement gate 904) for the independent gate contacts (also referred to herein as 'independent gate contact opening 1602' and 'independent gate contact opening 1604') in the third ILD 1402 and dielectric gate cap 1102, and which extend down to the bottom-level FET gate I (i.e., an isolated portion of first replacement gate 902) and the top-level FET gate II (i.e., an isolated portion of the second replacement gate 904), respectively. See FIG. 16 (a Y-Y' cross-sectional view). A selective RIE can be employed for the gate contact opening etch. As shown in FIG. 16, the formation of independent gate contact opening 1602 involves the selective etching of the dielectric gate cap 1102 in between the dielectric sidewall spacers 702 and the dielectric gate cut 1304 over the bottom-level FET gate I (i.e., an isolated portion of first replacement gate 902). As provided above, the materials selected for the dielectric gate cap 1102 as compared to those selected for the dielectric sidewall spacers 702 and the dielectric gate cut 1304 enable this selective etch. As such, the independent gate contact opening 1602 formed in this manner is self-aligned to the underlying bottom-level FET gate I (i.e., an isolated portion of first replacement gate 902). Likewise, the patterning independent gate contact opening 1604 in between the dielectric sidewall spacers 702 and the dielectric gate divider 1302 ensures that the independent gate contact opening 1604 is formed over the top-level FET gate II (i.e., an isolated portion of the second replacement gate 904).

Figure 17:
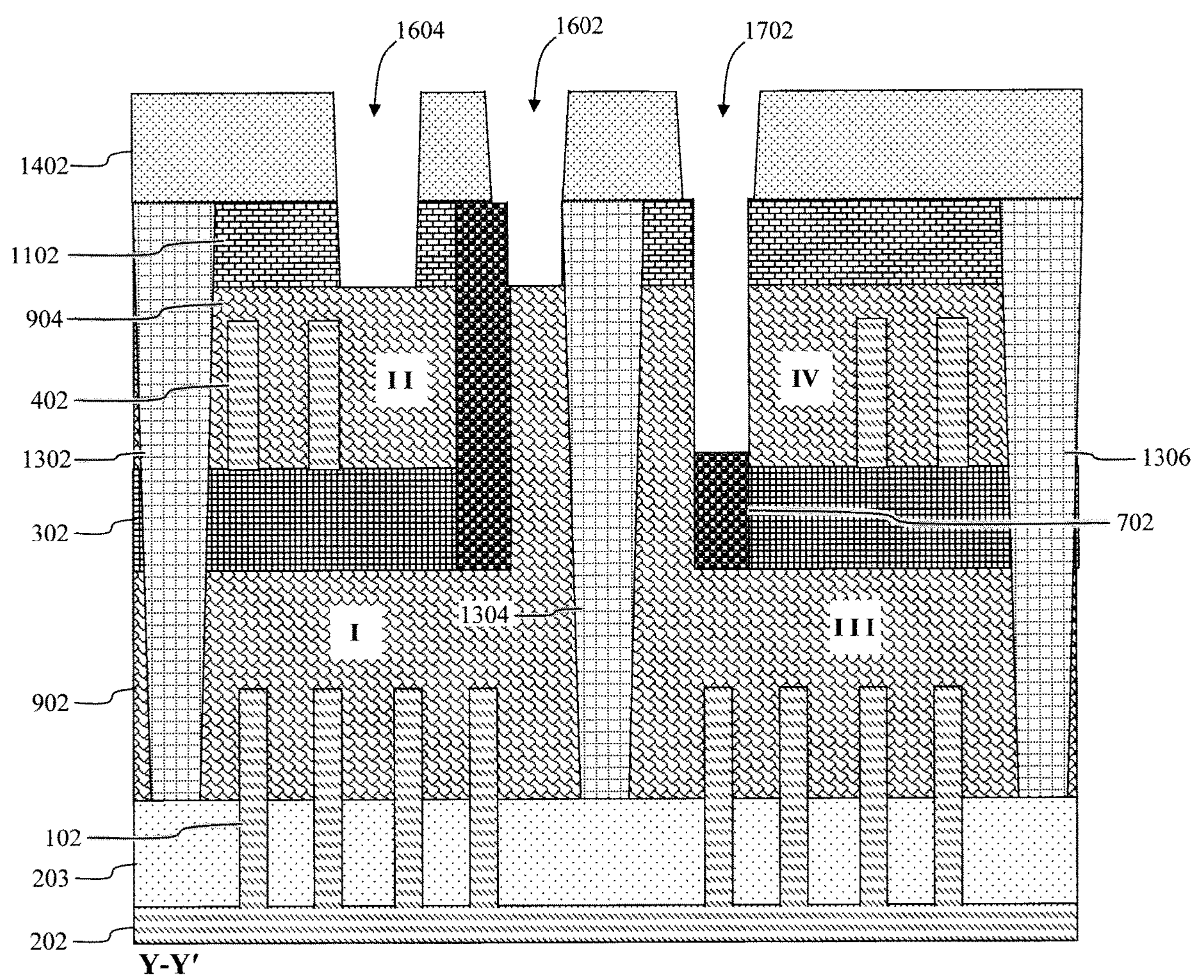
FIG. 17 is a Y-Y' cross-sectional view illustrating a shared gate contact opening having been formed to another isolated portion of the first replacement gate and another isolated portion of the second replacement gate according to an embodiment of the present invention.

Standard lithography and etching techniques (see above) are then used to form a gate contact opening 1702 to the bottom-level FET gate III (i.e., the other isolated portion of first replacement gate 902) and the top-level FET gate IV (i.e., the other isolated portion of the second replacement gate 904) for the shared gate contact (also referred to herein as 'shared gate contact opening 1702') in the third ILD 1402, dielectric gate cap 1102, and one of the dielectric sidewall spacers 702. See FIG. 17 (a Y-Y' cross-sectional view). A selective etching process such as RIE can be employed for the gate contact opening etch. As shown in FIG. 17, the formation of shared gate contact opening 1702 involves the etching of one of the dielectric sidewall spacers 702 selective to the dielectric gate cap 1102 and in between the bottom-level FET gate III (i.e., the other isolated portion of first replacement gate 902) and the top-level FET gate IV (i.e., the other isolated portion of the second replacement gate 904). As such, the shared gate contact opening 1702 formed in this manner is self-aligned to both the bottom-level FET gate III (i.e., the other isolated portion of first replacement gate 902) and the top-level FET gate IV (i.e., the other isolated portion of the second replacement gate 904).

The top-level FET source/drain contact openings 1502, independent gate contact openings 1602/1604 and shared gate contact opening 1702 are then filled with a metal or a combination of metals to form top-level FET source/drain contacts 1802, independent gate contacts 1804/1806 and shared gate contact 1808, respectively. See FIG. 18A (an X-X' cross-sectional view) and FIG. 18B (a Y-Y' cross-sectional view).

As shown in magnified view 1820, according to an exemplary embodiment, the top-level FET source/drain contacts 1802, independent gate contacts 1804/1806 and shared gate contact 1808 each includes a silicide liner 1812 lining the top-level FET source/drain contact openings 1502, independent gate contact openings 1602/1604 and shared gate contact opening 1702, respectively, a adhesion/barrier layer 1814 disposed on the silicide liner 1812, and a conductive fill metal 1816 disposed on the adhesion/barrier layer 1814. Suitable materials for the silicide liner 1812 include, but are not limited to, titanium (Ti), nickel (Ni) and/or nickel platinum (NiPt). Suitable materials for the adhesion/barrier layer 1814 include, but are not limited to, tantalum (Ta), TaN, titanium (Ti) and/or TiN. Use of adhesion/barrier layer 1814 helps to prevent diffusion of the metal(s) into the surrounding ILD 508/1402. Suitable conductive fill metals 1816 include, but are not limited to, copper (Cu), tungsten (W), ruthenium (Ru) and/or cobalt (Co). The contact metal(s) can be deposited into the top-level FET source/drain contact openings 1502, the independent gate contact openings 1602/1604 and shared gate contact opening 1702 using a process such as evaporation, sputtering, ALD, CVD or electrochemical plating. Following deposition, the metal overburden can be removed using a process such as CMP. Additionally, a seed layer (not shown) can be deposited into and lining the top-level FET source/drain contact openings 1502, the independent gate contact openings 1602/1604 and shared gate contact opening 1702 prior to metal deposition, i.e., to facilitate plating of the metal.

Based on the above-described process, independent gate contact 1804 is in direct contact with a top surface of the upper portion of the bottom-level FET gate I (i.e., an isolated portion of first replacement gate 902) on one side of the adjacent dielectric sidewall spacer 702, and the independent gate contact 1806 is in direct contact with a top surface of the top-level FET gate II (i.e., an isolated portion of the second replacement gate 904) on another side of that adjacent dielectric sidewall spacer 702. The shared gate contact 1808 is in direct contact with the sidewalls of both the upper portion of the bottom-level FET gate III (i.e., the other isolated portion of first replacement gate 902) and the top-level FET gate IV (i.e., the other isolated portion of the second replacement gate 904).

Figure 18A:
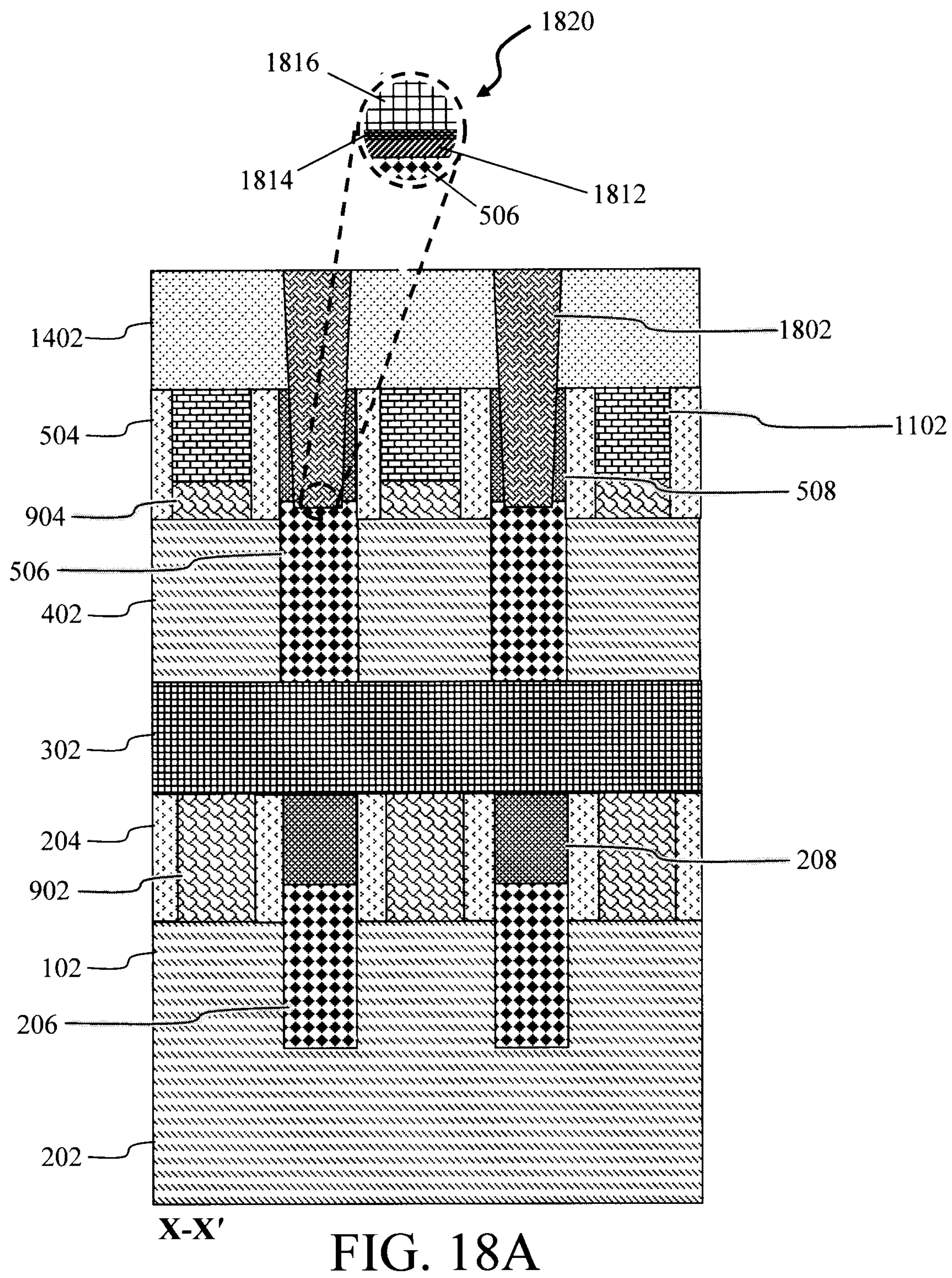
FIG. 18A is an X-X' cross-sectional view illustrating the top-level FET source/drain contact openings, independent gate contact openings and shared gate contact opening having been filled with a metal(s) to form top-level FET source/drain contacts, independent gate contacts and a shared gate contact.
Figure 18B:
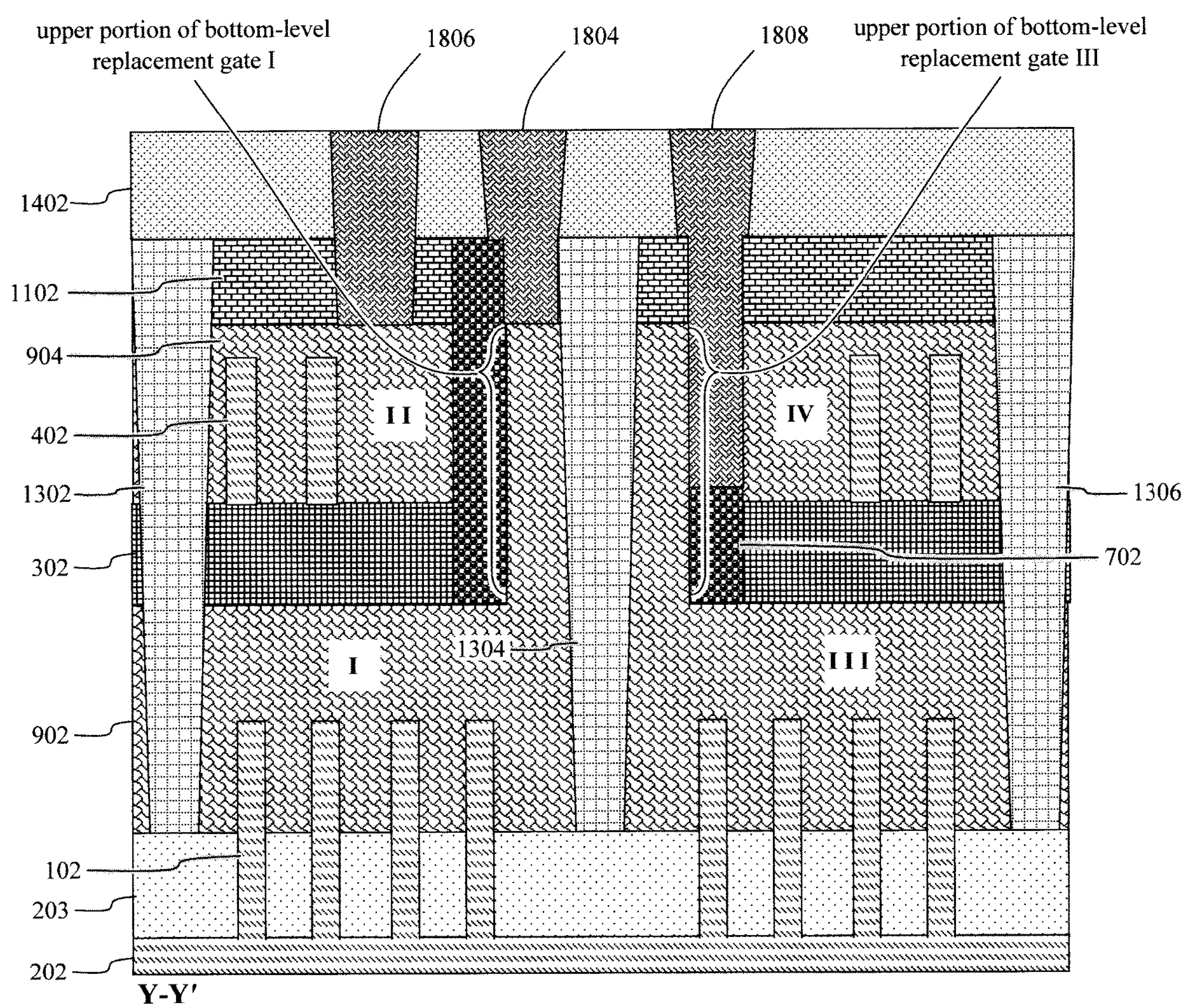
FIG. 18B is a Y-Y' cross-sectional view illustrating the top-level FET source/drain contact openings, independent gate contact openings and shared gate contact opening having been filled with the metal(s) to form the top-level FET source/drain contacts, the independent gate contacts and the shared gate contact according to an embodiment of the present invention.

As shown in FIG. 18B, the upper portions of the bottom-level FET gate I (i.e., an isolated portion of first replacement gate 902) and bottom-level FET gate III (i.e., the other isolated portion of first replacement gate 902) are adjacent to the top-level FET gate II (i.e., an isolated portion of the second replacement gate 904) and the top-level FET gate IV (i.e., the other isolated portion of the second replacement gate 904). Further, as highlighted above, the top surfaces of the upper portions of the bottom-level FET gate I (i.e., an isolated portion of first replacement gate 902) and bottom-level FET gate III (i.e., the other isolated portion of first replacement gate 902) are coplanar with the top surfaces of the top-level FET gate II (i.e., an isolated portion of the second replacement gate 904) and the top-level FET gate IV (i.e., the other isolated portion of the second replacement gate 904). Dielectric sidewall spacers 702 are present in between the upper portions of the bottom-level FET gate I (i.e., an isolated portion of first replacement gate 902)/bottom-level FET gate III (i.e., the other isolated portion of first replacement gate 902) and the top-level FET gate II (i.e., an isolated portion of the second replacement gate 904)/top-level FET gate IV (i.e., the other isolated portion of the second replacement gate 904).

Figure 19:
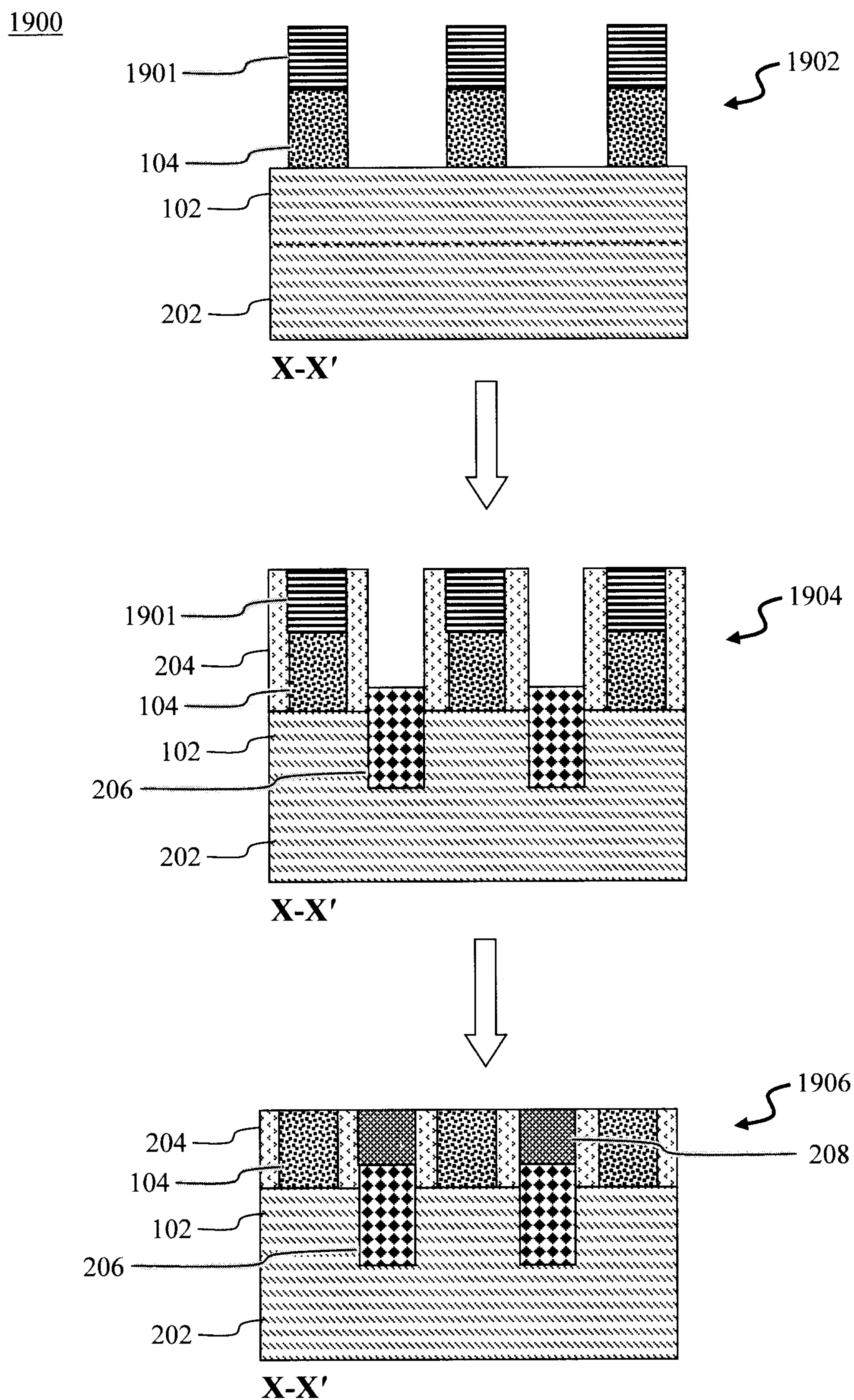
FIG. 19 is a diagram illustrating an exemplary methodology for forming the starting bottom- and top-level FETs according to an embodiment of the present invention.

Further details of the above-described process for forming the bottom-level (and top-level) FETs are provided are now provided by way of reference to methodology 1900 of FIG. 19. Methodology 1900 depicts the process for forming of the starting bottom-level FET(s) shown/described in conjunction with the description of FIGS. 2A and 2B, above. However, the same process can be employed in the same manner for forming the top-level FET(s) shown/described in conjunction with the description of FIGS. 5A and 5B, above. Like structures are numbered alike throughout the figures.

As described above, following deposition of a sacrificial gate material on the bottom-level FET fins 102, a sacrificial gate hardmask 1901 is formed on the sacrificial gate material marking the footprint and location of the sacrificial gates 104. The sacrificial gate hardmask is then used to pattern the sacrificial gate material into the individual sacrificial gates 104. See step 1902.

Gate spacers 204 are formed on opposite sides of the sacrificial gates 104 and the sacrificial gate hardmask 1901. See step 1904. As shown in step 1904, after formation of the gate spacers 204, the exposed portions of the bottom-level FET fins 102 that are not covered by the sacrificial gates 104 or gate spacers 204 are recessed, followed by epitaxial growth of the bottom-level FET source/drain regions 206.

Following formation of the bottom FET source/drain regions 206, the ILD 208 is deposited over the bottom FET source/drain regions 206 and burying the sacrificial gates 104/gate spacers 204. See step 1906. As shown in step 1906, following deposition the ILD 208 is polished down to the top surface of the sacrificial gates 104 using a process such as CMP, fully removing the sacrificial gate hardmask 1901 from over the sacrificial gates 104.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A stacked field-effect transistor (FET) device, comprising:

at least one bottom-level FET comprising a bottom-level FET gate;

at least one top-level FET, over the at least one bottom-level FET, comprising a top-level FET gate, wherein an upper portion of the bottom-level FET gate is adjacent to the top-level FET gate;

a dielectric sidewall spacer in between the upper portion of the bottom-level FET gate and the top-level FET gate;

a gate contact in contact with a sidewall of the upper portion of the bottom-level FET gate and a sidewall of the top-level FET gate; and a dielectric gate cap disposed over the bottom-level FET gate and the top-level FET gate, wherein the dielectric gate cap comprises a different dielectric material from the dielectric sidewall spacer.

2. The stacked FET device of claim 1, further comprising:

a first independent gate contact in direct contact with a top surface of the upper portion of the bottom-level FET gate on one side of the dielectric sidewall spacer; and a second independent gate contact in direct contact with a top surface of the top-level FET gate on another side of the dielectric sidewall spacer.

3. The stacked FET device of claim 1, wherein the gate contact is a shared gate contact.

4. The stacked FET device of claim 1, wherein a top surface of the upper portion of the bottom-level FET gate is substantially coplanar with a top surface of the top-level FET gate.

5. The stacked FET device of claim 1, wherein the dielectric sidewall spacer comprises a dielectric material selected from the group consisting of: silicon oxycarbide (SiCO), silicon carbide (SiC), and combinations thereof.

6. The stacked FET device of claim 1, wherein the dielectric gate cap comprises a dielectric material selected from the group consisting of: silicon nitride (SiN), silicon oxynitride (SiON), silicon carbide nitride (SiCN), and combinations thereof.

7. A device, comprising:

at least one first stacked field-effect transistor (FET) device comprising a first bottom-level FET having a bottom-level FET gate I and a first top-level FET, over the first bottom-level FET, having a top-level FET gate II, wherein an upper portion of the bottom-level FET gate I is adjacent to the top-level FET gate II;

at least one second stacked FET device comprising a second bottom-level FET having a bottom-level FET gate III and a second top-level FET, over the second bottom-level FET, having a top-level FET gate IV, wherein an upper portion of the bottom-level FET gate III is adjacent to the top-level FET gate IV;

dielectric sidewall spacers in between the upper portion of the bottom-level FET gate I and the top-level FET gate II, and in between the upper portion of the bottom-level FET gate III and the top-level FET gate IV;

a gate contact in contact with a sidewall of the upper portion of the bottom-level FET gate III and a sidewall of the top-level FET gate IV; and a dielectric gate cap disposed on both the upper portion of the bottom-level FET gate and the top-level FET gate, wherein the dielectric gate cap comprises a different dielectric material from the dielectric sidewall spacers.

8. The device of claim 7, further comprising:

a first independent gate contact in direct contact with a top surface of the upper portion of the bottom-level FET gate I on one side of the dielectric sidewall spacer; and a second independent gate contact in direct contact with a top surface of the top-level FET gate II on another side of the dielectric sidewall spacer.

9. The device of claim 7, wherein the gate contact is a shared gate contact.

10. The device of claim 7, wherein the dielectric sidewall spacers comprise a dielectric material selected from the group consisting of: SiCO, SiC, and combinations thereof.

11. The device of claim 7, wherein the dielectric gate cap comprises a dielectric material selected from the group consisting of: SiN, SiON, SiCN, and combinations thereof.

12. The device of claim 7, further comprising:

a dielectric gate divider separating the bottom-level FET gate I from the bottom-level FET gate III.

13. The device of claim 12, wherein the dielectric gate divider comprises a different material from the dielectric gate cap.

14. The device of claim 12, wherein the dielectric gate divider comprises a dielectric material selected from the group consisting of: SiCO, SiC, and combinations thereof.

15. A method for forming a stacked field-effect transistor (FET) device, the method comprising:

forming at least one bottom-level FET comprising a first sacrificial gate;

forming at least one top-level FET over the at least one bottom-level FET, the at least one top-level FET comprising a second sacrificial gate;

patterning a bottom gate access opening in the second sacrificial gate that extends down to the first sacrificial gate;

forming dielectric sidewall spacers along sidewalls of the bottom gate access opening;

removing the first sacrificial gate and the second sacrificial gate to form first gate trenches in the bottom-level FET and second gate trenches in the top-level FET;

forming a gate contact in contact with a sidewall of bottom-level FET gate and a sidewall of the top-level FET gate;

forming a first replacement gate in the first gate trenches and in the bottom gate access opening, and a second replacement gate in the second gate trenches; and forming a dielectric gate cap on the first replacement gate and the second replacement gate, wherein the dielectric gate cap comprises a different dielectric material from the dielectric sidewall spacers.

16. The method of claim 15, further comprising:

recessing the first replacement gate and the second replacement gate prior to forming the dielectric gate cap on the first replacement gate and the second replacement gate.

17. The method of claim 15, further comprising:

forming an independent gate contact opening over the first replacement gate by etching the dielectric gate cap selective to the dielectric sidewall spacers; and forming an independent gate contact to the first replacement gate in the independent gate contact opening.

18. The method of claim 15, further comprising:

forming a shared gate contact opening alongside the first replacement gate and the second replacement gate by etching one of the dielectric sidewall spacers selective to the dielectric gate cap; and forming a shared gate contact to the first replacement gate and the second replacement gate in the shared gate contact opening.

19. The method of claim 15, wherein the dielectric sidewall spacers comprise a dielectric material selected from the group consisting of: SiCO, SiC, and combinations thereof.

20. The method of claim 15, wherein the dielectric gate cap comprises a dielectric material selected from the group consisting of: SiN, SiON, SiCN, and combinations thereof.

* * * * *